(12) United States Patent
Matsueda et al.

(10) Patent No.: US 10,490,604 B2
(45) Date of Patent: Nov. 26, 2019

(54) PIXEL ARRAY, ELECTRO-OPTIC DEVICE, AND ELECTRIC APPARATUS EACH HAVING ONE SUBPIXEL WITH A CENTER OF GRAVITY CLOSER TO A CENTER OF GRAVITY OF PIXEL THAN OTHER SUBPIXELS

(71) Applicant: NLT Technologies, Ltd., Kanagawa (JP)

(72) Inventors: Yojiro Matsueda, Kanagawa (JP);
Kenichi Takatori, Kanagawa (JP);
Yoshihiro Nonaka, Kanagawa (JP)

(73) Assignee: TIANMA MICROELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/690,673

(22) Filed: Apr. 20, 2015

(65) Prior Publication Data
US 2015/0311265 A1 Oct. 29, 2015

(30) Foreign Application Priority Data

Apr. 23, 2014 (JP) ................................ 2014-089325

(51) Int. Cl.
*H01L 27/32* (2006.01)
*H01L 51/52* (2006.01)

(52) U.S. Cl.
CPC ...... *H01L 27/3218* (2013.01); *H01L 27/3211* (2013.01); *H01L 27/3216* (2013.01);
(Continued)

(58) Field of Classification Search
CPC ............. H01L 27/3211; H01L 27/3216; H01L 27/3218; H01L 27/3262
See application file for complete search history.

(56) References Cited

U.S. PATENT DOCUMENTS 6,771,028 B1 8/2004 Winters
9,013,098 B1 * 4/2015 Kim ................... H01L 27/3218
313/504

(Continued)

FOREIGN PATENT DOCUMENTS

JP   2008-015521 A   1/2008
JP   2008-153237 A   7/2008
JP   2011-249334   12/2011

OTHER PUBLICATIONS

Japanese Office Action issued in Application No. 2014-089325, dated Feb. 13, 2018 with English Translation.

*Primary Examiner* — Michael Jung
(74) *Attorney, Agent, or Firm* — Young & Thompson

(57) ABSTRACT

There are provided a pixel array, an electro-optic device, and an electric apparatus. A pixel array includes plural pixels each having a rectangular shape and including a first-colored sub-pixel of a first color being the maximum in relative luminosity, a second-colored sub-pixel, and a third-colored sub-pixel of a third color being the minimum in relative luminosity. The third-colored sub-pixel is greater in size than each of the first-colored sub-pixel and the second-colored sub-pixel, and is arranged next to the first-colored sub-pixel and the second-colored sub-pixel. The center of gravity of the first-colored sub-pixel is located nearer to the center of gravity of the pixel than that of the second-colored sub-pixels, and/or the center of gravity of a part of the third-colored sub-pixel at the second-colored-sub-pixel side is located at a shorter distance to the center of gravity of the pixel than that of the other part of the third-colored sub-pixel.

9 Claims, 25 Drawing Sheets

(52) U.S. Cl.
CPC ...... *H01L 27/3262* (2013.01); *H01L 51/5256* (2013.01); *H01L 2227/323* (2013.01); *H01L 2251/5338* (2013.01)

(56) References Cited

U.S. PATENT DOCUMENTS

| | | | |
|---|---|---|---|
| 2002/0186214 A1 | 12/2002 | Siwinski | |
| 2004/0113875 A1 | 6/2004 | Miller et al. | |
| 2004/0201558 A1 | 10/2004 | Arnold et al. | |
| 2006/0017375 A1 | 1/2006 | Noguchi et al. | |
| 2007/0090362 A1* | 4/2007 | Ahn | B82Y 10/00 257/66 |
| 2008/0001525 A1 | 1/2008 | Chao et al. | |
| 2011/0291550 A1 | 12/2011 | Kim et al. | |
| 2012/0049726 A1* | 3/2012 | Yoo | H01L 27/3213 313/504 |
| 2012/0056531 A1* | 3/2012 | Park | H01L 27/3211 313/506 |
| 2013/0002118 A1* | 1/2013 | Ko | H01L 27/3216 313/1 |
| 2013/0083092 A1* | 4/2013 | Shin | G09G 3/36 345/690 |
| 2014/0361965 A1* | 12/2014 | Cheng | G09G 3/3208 345/83 |
| 2015/0144908 A1* | 5/2015 | Yoon | H01L 27/3216 257/40 |
| 2015/0270317 A1* | 9/2015 | Lee | H01L 27/3218 257/40 |
| 2015/0287767 A1* | 10/2015 | Lee | H01L 27/3216 257/40 |
| 2015/0311268 A1* | 10/2015 | Cheng | H01L 27/3216 257/40 |

* cited by examiner

LINE PASSING CENTER OF GRAVITY OF PIXEL

— LINE PASSING CENTER OF GRAVITY OF PIXEL

— LINE PASSING CENTER OF GRAVITY
OF G SUB-PIXEL IN CONVENTIONAL
S-STRIPE ARRANGEMENT

— LINE PASSING CENTER OF GRAVITY OF PIXEL

→X
↓Y

LINE PASSING CENTER OF GRAVITY OF R&G SUB-PIXELS
IN CONVENTIONAL S-STRIPE ARRANGEMENT

LINE PASSING CENTER OF GRAVITY OF PIXEL

— LINE PASSING CENTER OF GRAVITY OF PIXEL
— LINE PASSING CENTER OF GRAVITY
OF G SUB-PIXEL IN CONVENTIONAL
S-STRIPE ARRANGEMENT

— LINE PASSING CENTER OF GRAVITY OF PIXEL

LINE PASSING CENTER OF
GRAVITY OF R&G SUB-PIXELS
IN CONVENTIONAL S-STRIPE ARRANGEMENT

POLYCRYSTALLINE SILICON LAYER 103 FOR DRIVE TFT

POLYCRYSTALLINE SILICON LAYER 103 FOR STORAGE CAPACITOR SECTION

POLYCRYSTALLINE SILICON LAYER 103 FOR SWITCH TFT

ORGANIC EL
DISPLAY DEVICE

ORGANIC EL
DISPLAY DEVICE

ORGANIC EL
DISPLAY DEVICE

ORGANIC EL
DISPLAY DEVICE

ORGANIC EL DISPLAY DEVICE

ORGANIC EL DISPLAY DEVICE

ORGANIC EL DISPLAY DEVICE

PIXEL ARRAY, ELECTRO-OPTIC DEVICE, AND ELECTRIC APPARATUS EACH HAVING ONE SUBPIXEL WITH A CENTER OF GRAVITY CLOSER TO A CENTER OF GRAVITY OF PIXEL THAN OTHER SUBPIXELS

TECHNICAL FIELD

The present invention relates to a pixel array, an electro-optic device, and an electric apparatus. In particular, the present invention relates to an array structure of sub-pixels in each pixel of a pixel array, an electro-optic device equipped with a pixel array having the array structure, and an electric apparatus employing the electro-optic device as a display unit.

BACKGROUND

Organic EL (Electro-Luminescent or electroluminescent) elements are current-driven self-light-emitting elements, and do not need a back light source. Further, the organic EL elements have advantages such as low power consumption, wide viewing angle, and high contrast ratio. Accordingly, organic EL elements are expected in development of applying flat panel display apparatuses.

In an organic EL display device using such an organic EL element, there are provided a number of pixels each formed by using R (Red), G (Green), and B (Blue) sub-pixels. By combining the colors of these sub-pixels, the organic EL display device can display images using a wide variety of colors. These RGB sub-pixels can be arrayed in various types of arrangement. Generally, such sub-pixels are arranged in a stripe arrangement in which sub-pixels of three colors are arranged side by side equally (a so-called RGB vertical stripe arrangement). The display apparatus can display full colors by adjusting luminance among these three color sub-pixels in each pixel. Usually, three neighboring sub-pixels in R, G, and B, are collectively worked as a single pixel (so called as "dot") having a rectangular shape, and a square arrangement of such pixels realizes a dot matrix display. The dot matrix display apparatus handles image data to be displayed, which forms an n×m pixel data matrix, in one-to-one correspondence with the pixels, so that the display apparatus can display a correct image.

Organic EL display devices can be classified into two types of display apparatus employing a standard of white organic EL elements, i.e., a color-filter type of display apparatus in which three colors of R, G, and B are produced by the color filter, and a side-by-side type of display apparatus in which sub-pixels are separately deposited with organic materials for three colors of R, G, and B. In the color-filter type, since a color filter absorbs a light partially, there are disadvantages that the light utilization efficiency decreases and power consumption increases. On the other hand, in the side-by-side type, a color gamut can be widened easily because of high color purity of the reproduced colors, and the light utilization efficiency increases because of not using the color filter. Accordingly, organic EL display devices of the side-by-side type have come to be used widely.

In the side-by-side type, a FMM (Fine Metal Mask) is used for depositing the sub-pixels separately with organic materials. With request of higher definition of organic EL display devices in recent years, the pitch of the FMM also requests higher precision, which makes a problem that production of the organic EL display devices becomes difficult. In view of the problem, there have been proposed the following pixel array structure utilizing the human being's color vision which is insensitive to colors of R and B and sensitive to G (a so-called PenTile arrangement), as disclosed in, for example, U.S. Pat. No. 6,771,028B, US2002/0186214A, US2004/0113875A, and US2004/0201558A. In the PenTile arrangement, each pixel is composed of sub-pixels in two colors of G and B, or G and R, and a pixel can apparently reproduce a certain color expression which needs a sub-pixel in a missing color in comparison to the RGB arrangement, by using a neighboring pixel including a sub-pixel in the missing color together with the sub-pixels of itself.

In the PenTile arrangement, since sub-pixels are smaller in number than those of the RGB vertical stripe arrangement, the dot width of each of R and B colors can be secured by a length corresponding to the width of two vertical stripes of the RGB vertical stripe arrangement. Accordingly, an aperture size of the FMM can be made larger, which makes the production of high-definition organic EL display devices easier. However, the PenTile arrangement is aimed at softening lack of color reproduction due to the reduction of the number of sub-pixels by using a technique of tiling, and will cause the following defects. For example, jaggies, which are step-wise line, appear in place of a curve lines to be originally displayed smoothly, and a line-shaped color change appears in an image of changing a color gradation and luminance continuously.

From such a circumstance, as a pixel array structure where the size of sub-pixels can be made larger than the conventional RGB vertical stripe arrangement and does not take place the deterioration of display quality similarly to the PenTile arrangement, there have been proposed the following pixel array structure (a so-called S-stripe arrangement) as disclosed in, for example, Japanese Unexamined Patent Application Publications (JP-A) No. 2011-249334 (corresponding to US2011/291550A). In the S-stripe arrangement, R sub-pixels and G sub-pixels are arranged alternately in the same column, and B sub-pixels are arranged in a column next to the column of R and G sub-pixels to as to be arrayed in a raw together with pairs of R and G sub-pixels. In this S-stripe arrangement, the width of sub-pixels can be made wider than those of the RGB vertical stripe arrangement, and an aperture size of the FMM can be made larger. Further, since RGB sub-pixels are all arranged in a single pixel, the S-stripe arrangement can provide an enhanced display quality in comparison to the PenTile arrangement.

Generally, among the RGB colors, the color which is the maximum in relative luminosity is G, followed by R and B in order, and the relative luminosity of G is higher than those of R and B. Therefore, depending on the arrangement of R, G, and B sub-pixels in a pixel, unbalance (deviation) arises in spatial distribution of relative luminosities within the pixel. For example, in the RGB vertical stripe arrangement, a G sub-pixel is arranged at the center of the pixel. Such an arrangement makes the spatial distribution of the total sum of relative luminosities of RGB colors the maximum at the center of gravity of the pixel, and reduces the unbalance of the relative luminosities within the pixel. On the other hand, in the PenTile arrangement, a G sub-pixel is arranged in a column adjacent to an edge of pixel; and in the S-stripe arrangement, a G sub-pixel is arranged at a corner of a pixel. The PenTile and S-stripe arrangements make the maximum position of the spatial distribution of the total sum of relative luminosities of RGB colors separated from the center of the pixel, and the unbalance of the relative luminosities increases within the pixel.

The unbalance of the relative luminosities is hardly perceived at an inner part of a displayed object in an image, but can be perceived conspicuously and causes a phenomenon such that an edge in an image is observed as being colored (so-called "color fringing") in the case where an image includes an edge extending along the row or column direction of pixels. Particularly, in the S-stripe arrangement, a G sub-pixel is located at the farthest position from the center of gravity of a pixel when being viewed along a diagonal line which does not pass the G sub-pixel among the diagonal lines of the pixel. Such arrangement makes the unbalance of relative luminosities remarkable, and further causes the deterioration of display quality due to the color fringing, which is a large problem. The present invention seeks to solve the problems.

SUMMARY

In view of the above-mentioned problems, there are provided illustrative pixel arrays, electro-optic devices equipped with the pixel array, and electric apparatuses employing the electro-optic device as a display unit as embodiments of the present invention. The illustrative pixel arrays of the present invention are capable of controlling the visibility of color fringing in an edges of the image and enhancing the display quality in the pixel array structure of the S-stripe arrangement.

According to one aspect of the present invention, a pixel array includes a plurality of pixels two-dimensionally arrayed, each of the pixels having a rectangular shape and including a first-colored sub-pixel emitting light of a first color, a second-colored sub-pixel emitting light of a second color, and a third-colored sub-pixel emitting light of a third color, where the first color is maximum in relative luminosity and the third color is minimum in relative luminosity, among the first color, the second color, and the third color. Each of the pixels has a center of gravity defined as an intersection of two diagonal lines of a minimum rectangle surrounding the first-colored sub-pixel, the second-colored sub-pixel and the third-colored sub-pixel. In each of the pixels, the first-colored sub-pixel and the second-colored sub-pixel are arrayed in a first direction, the third-colored sub-pixel is arranged next to the first-colored sub-pixel and the second-colored sub-pixel in a second direction being perpendicular to the first direction, and the third-colored sub-pixel is greater in size than each of the first-colored sub-pixel and the second-colored sub-pixel. In each of the pixels, one or both of the center of gravity of the first-colored sub-pixel and the center of gravity of the second-colored sub-pixel is located as follows. A center of gravity of the first-colored sub-pixel is located nearer to a center of gravity of the pixel than the center of gravity of the second-colored sub-pixel. On the other hand, under the assumption that the third-colored sub-pixel is divided, by a line passing the center of gravity of the pixel and running in the second direction, into a first part facing the second-colored sub-pixel and a second part facing the first-colored sub-pixel, a center of gravity of the first part of the third-colored sub-pixel is located at a shorter distance in the second direction to the center of gravity of the pixel in comparison with a center of gravity of the second part of the third-colored sub-pixel.

According to another aspect of the present invention, a pixel array includes a plurality of pixels two-dimensionally arrayed, each of the pixels having a rectangular shape and including a first-colored sub-pixel emitting light of a first color, a second-colored sub-pixel emitting light of a second color, and a third-colored sub-pixel emitting light of a third color, where the first color is maximum in relative luminosity and the third color is minimum in relative luminosity, among the first color, the second color, and the third color. Each of the pixels has a center of gravity defined as an intersection of two diagonal lines of a minimum rectangle surrounding the first-colored sub-pixel, the second-colored sub-pixel and the third-colored sub-pixel. In each of the pixels, the first-colored sub-pixel and the second-colored sub-pixel are arrayed in a first direction, the third-colored sub-pixel is arranged next to the first-colored sub-pixel and the second-colored sub-pixel in a second direction being perpendicular to the first direction, and the third-colored sub-pixel is greater in size than each of the first-colored sub-pixel and the second-colored sub-pixel. The first-colored sub-pixel and the third-colored sub-pixel have at least one of arrangements that a part of the first-colored sub-pixel is trimmed in comparison with a corresponding part of the second-colored sub-pixel, where the part of the first-colored sub-pixel is opposite to another part of the first-colored sub-pixel facing the center of gravity of the pixel; and that a corner part of a half of the third-colored sub-pixel, facing the second-colored sub-pixel, is trimmed in comparison with the other half of the third-colored sub-pixel, facing the first-colored sub-pixel, and the trimmed corner part of the half of the third-colored sub-pixel is farther from the other corner part of the half of the third-colored sub-pixel.

According to another aspect of the present invention, a pixel array includes a plurality of pixels two-dimensionally arrayed, each of the pixels having a rectangular shape and including a first-colored sub-pixel emitting light of a first color, a second-colored sub-pixel emitting light of a second color, and a third-colored sub-pixel emitting light of a third color, where the first color is maximum in relative luminosity and the third color is minimum in relative luminosity, among the first color, the second color, and the third color. In each of the pixels, the third-colored sub-pixel is greater in size than each of the first-colored sub-pixel and the second-colored sub-pixel, and extends between neighboring two corners among four corners of the pixel having a rectangular shape, the second-colored sub-pixel is located adjacent to one of the remaining two corners among the four corners of the pixel, and the first-colored sub-pixel is located adjacent to the other of the remaining two corners. The first-colored sub-pixel and the third-colored sub-pixel have at least one of arrangements that a part of the first-colored sub-pixel is trimmed in comparison with a corresponding part of the second-colored sub-pixel, where the part of the first-colored sub-pixel is adjacent to the other of the remaining two corners; and that a part of the third-colored sub-pixel is trimmed in comparison with another part of the third-colored sub-pixel, where the part of the third-colored sub-pixel is adjacent to a corner at a side of the second-colored sub-pixel between the neighboring two corners of the pixel and the another part of the third-colored sub-pixel is adjacent to a corner at a side of the first-colored sub-pixel between the neighboring two corners of the pixel.

Other features of embodiments will be described below.

BRIEF DESCRIPTION OF THE DRAWINGS

Embodiments will now be described, by way of example only, with reference to the accompanying drawings which are meant to be exemplary, not limiting, and wherein like elements numbered alike in several figures, in which.

Figure 9A:
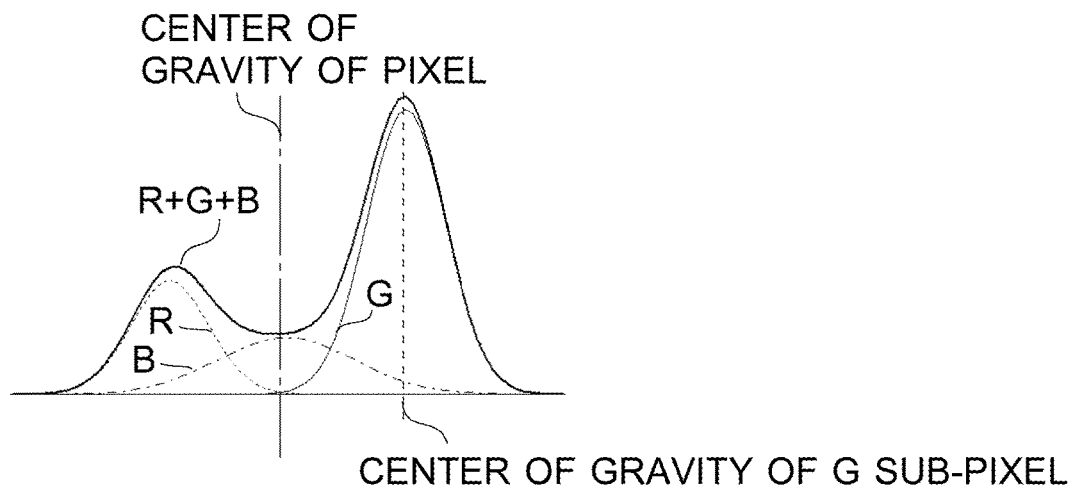
Figure 9B:
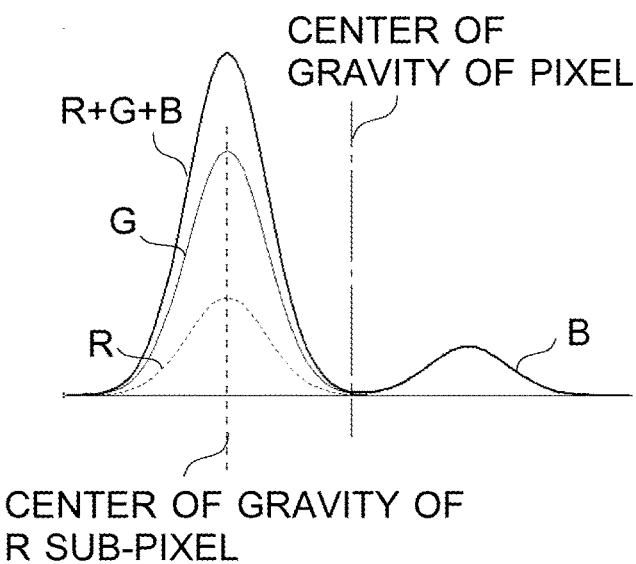
Figure 10:
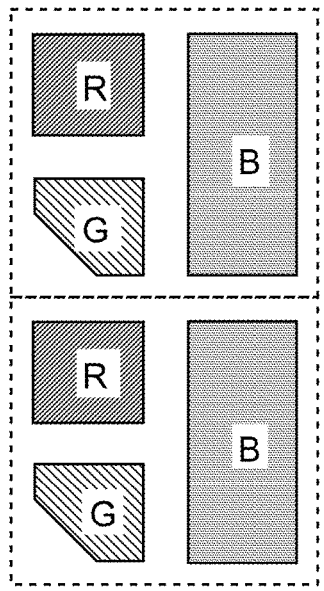
Figure 11:
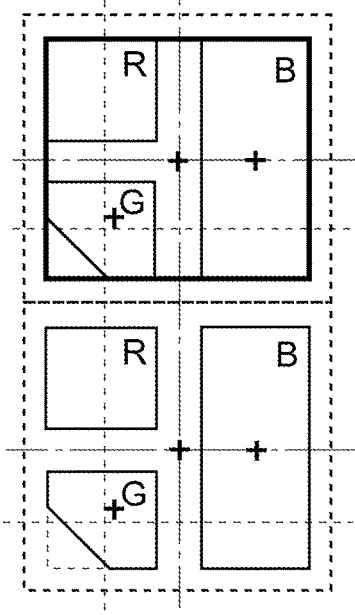
Figure 12A:
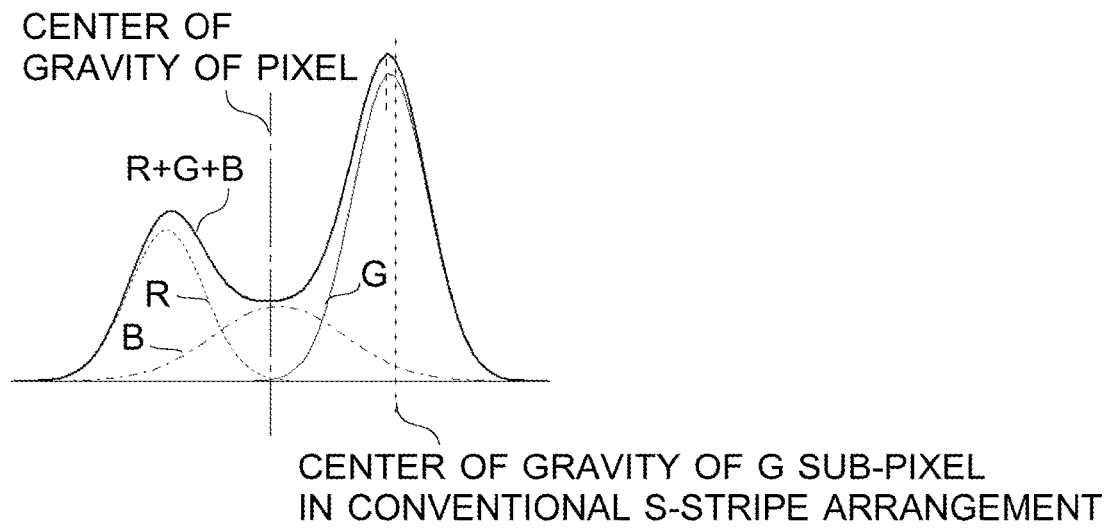
Figure 12B:
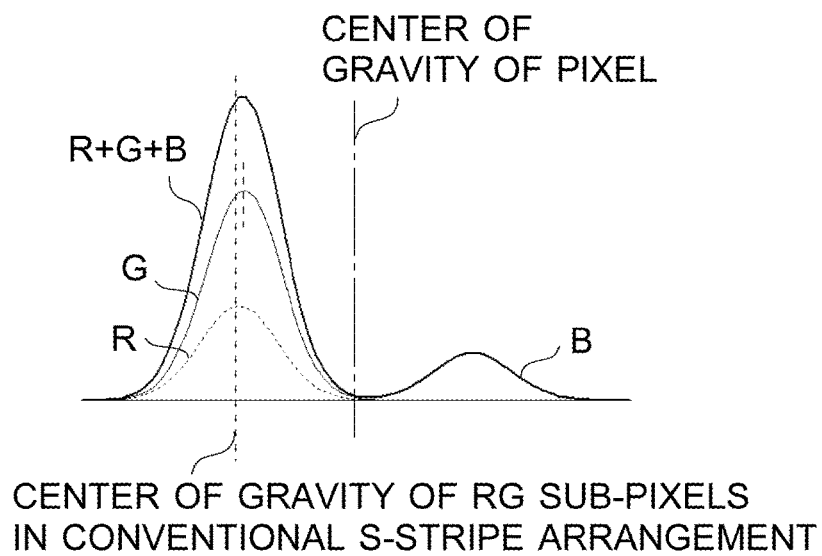
Figure 13:
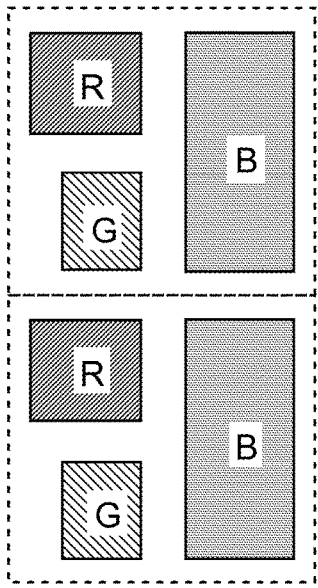
Figure 14:
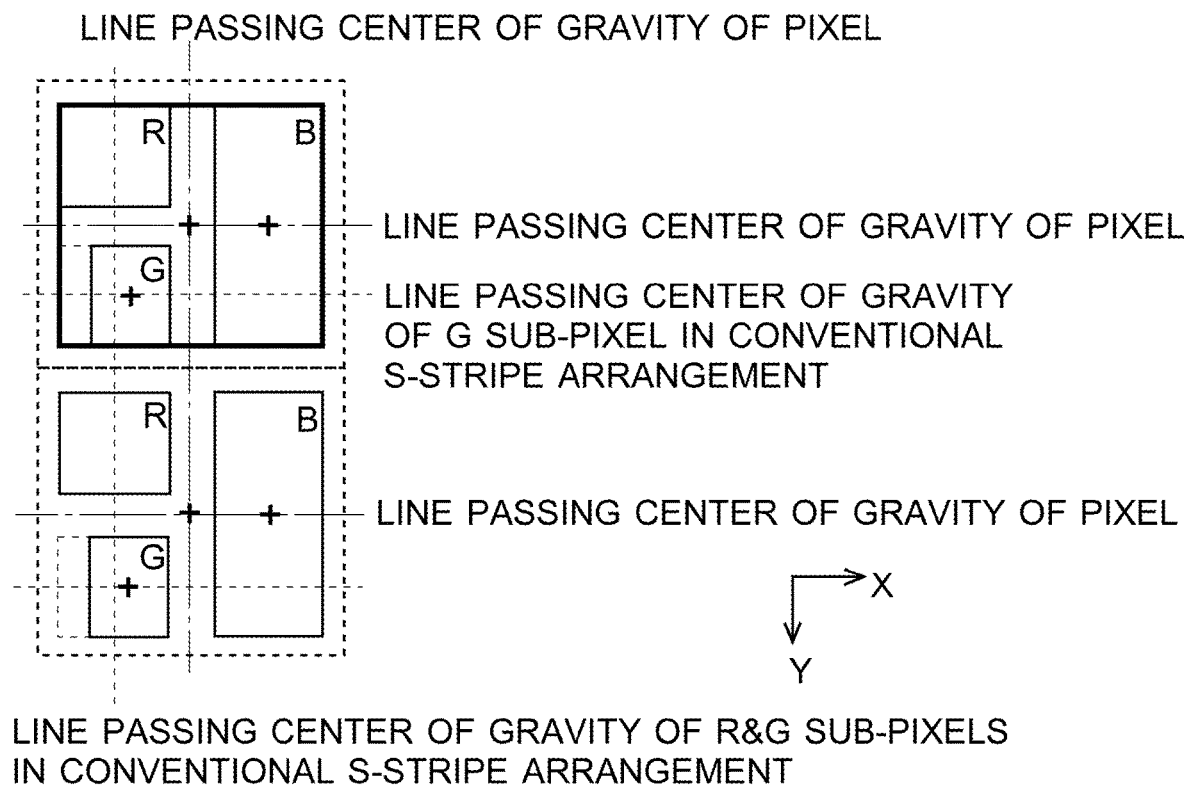
Figure 15A:
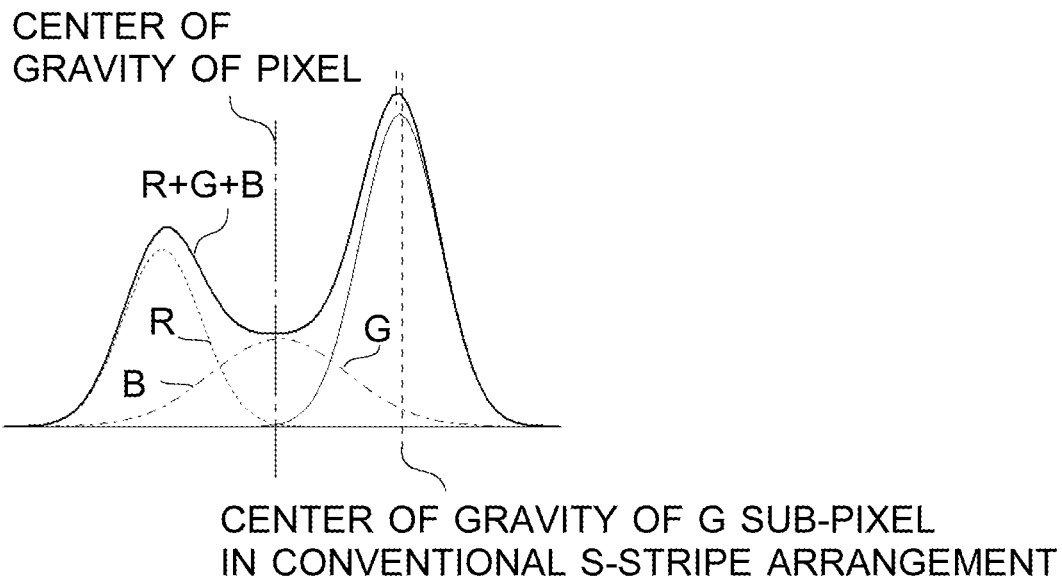
Figure 15B:
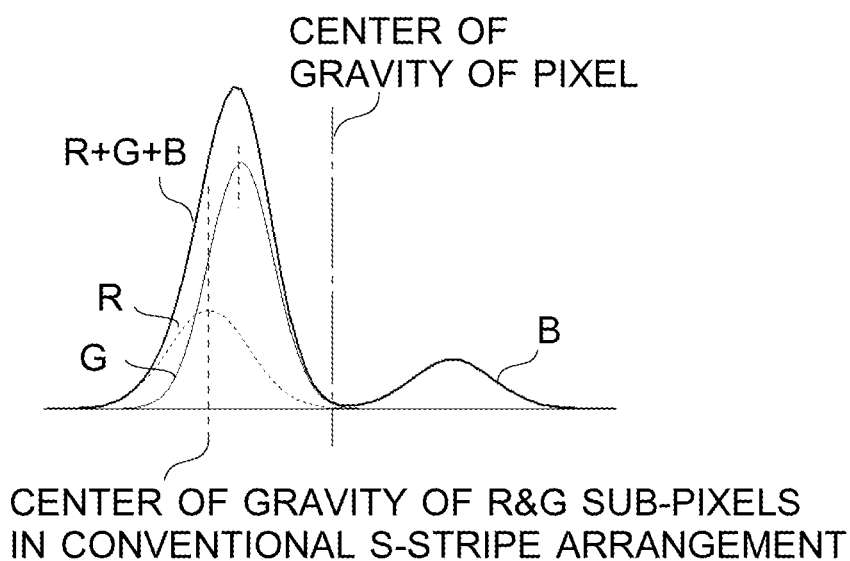
Figure 16:
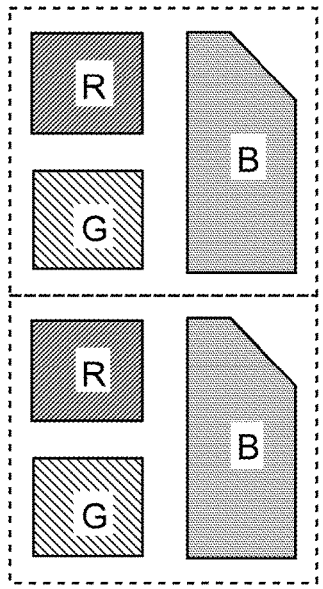
Figure 17A:
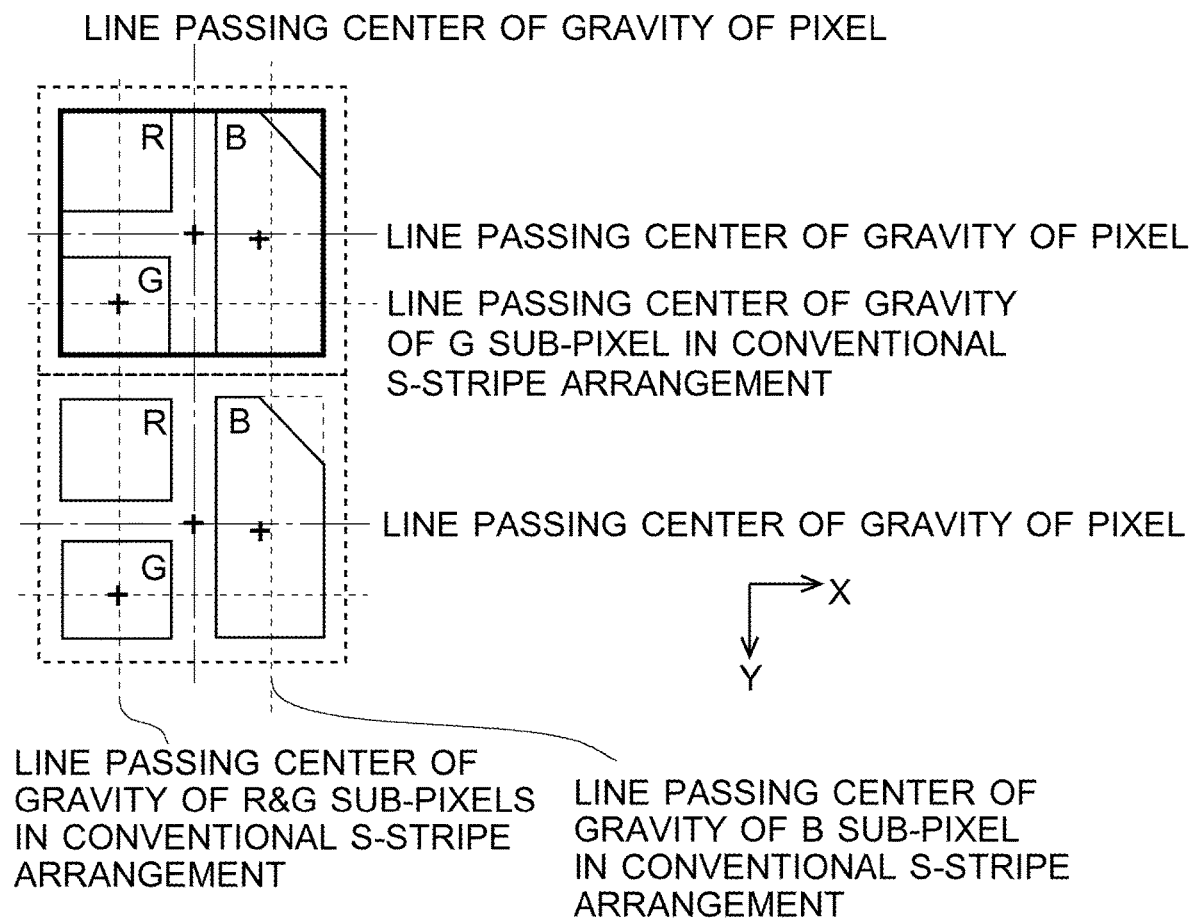
Figure 17B:
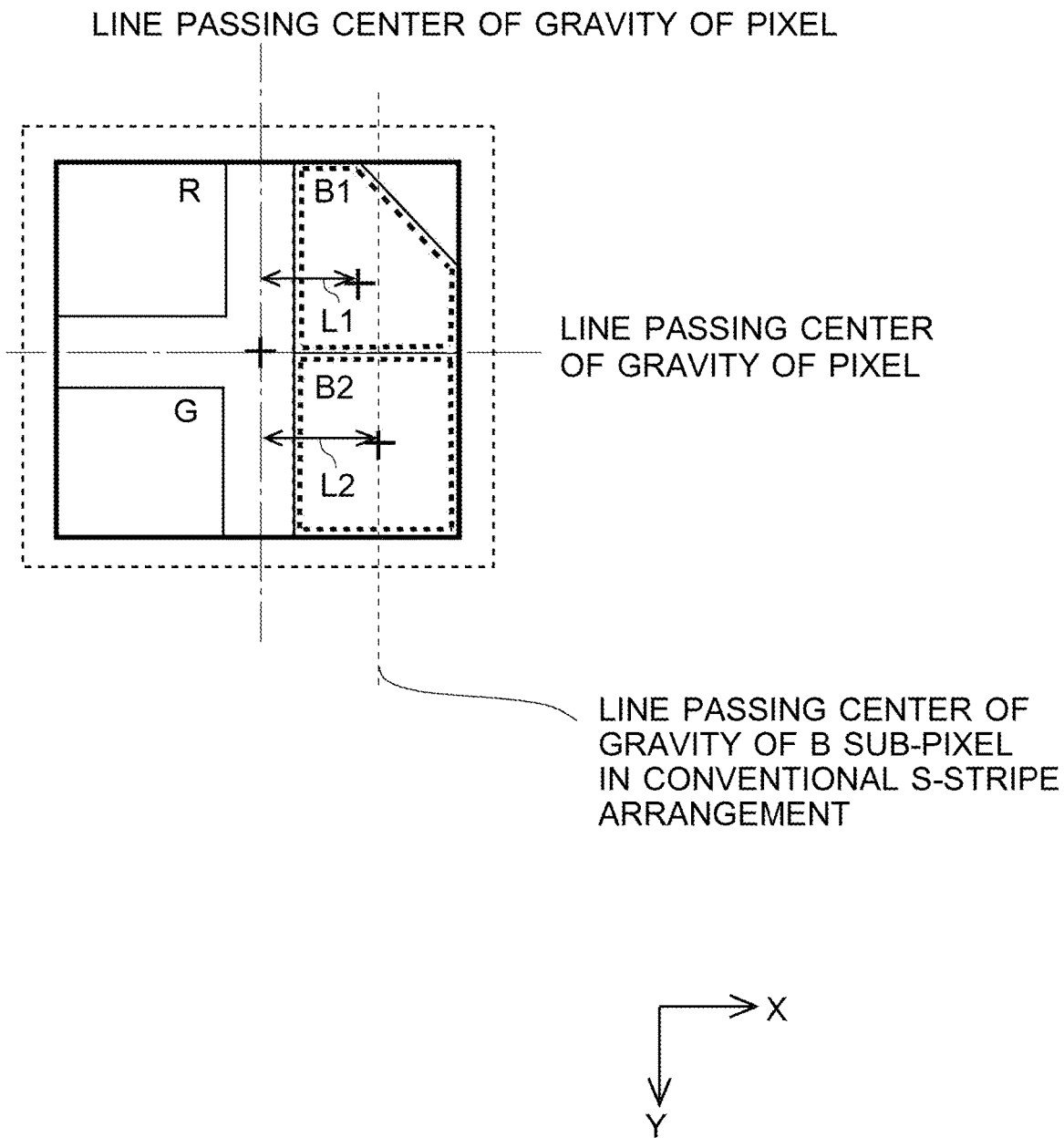
Figure 18A:
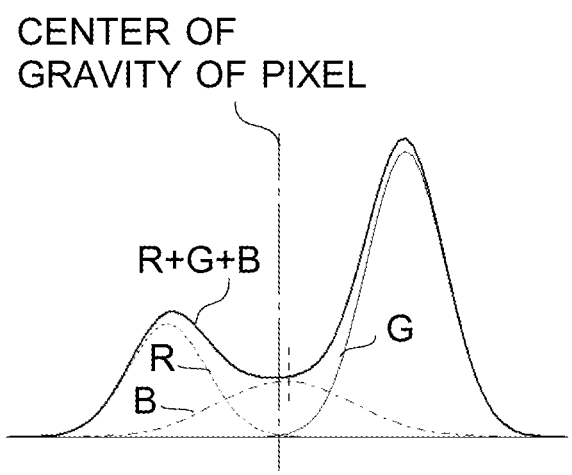
Figure 18B:
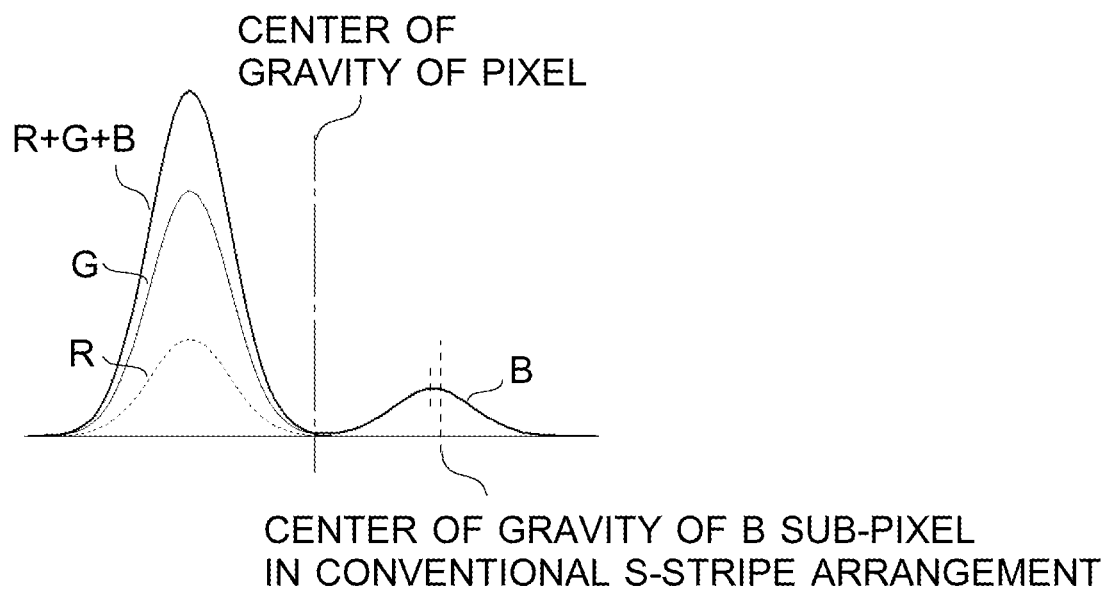
Figure 19:
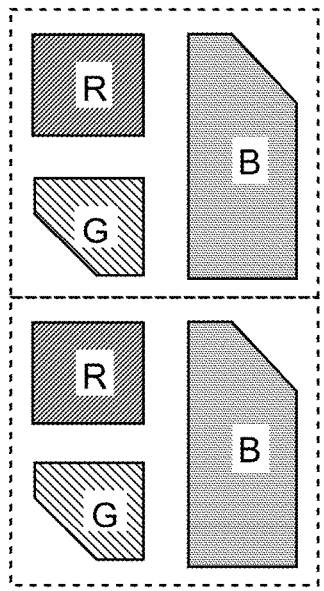
Figure 20:
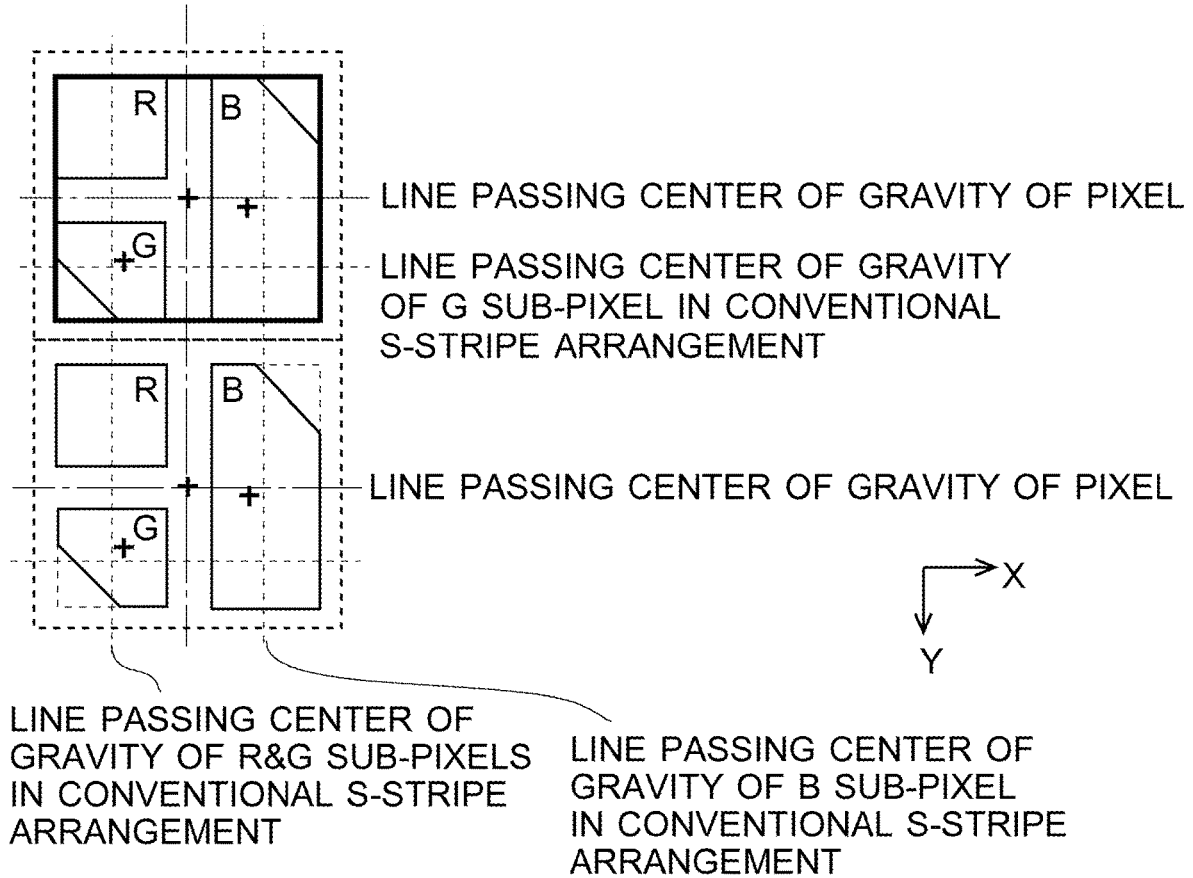
Figure 21A:
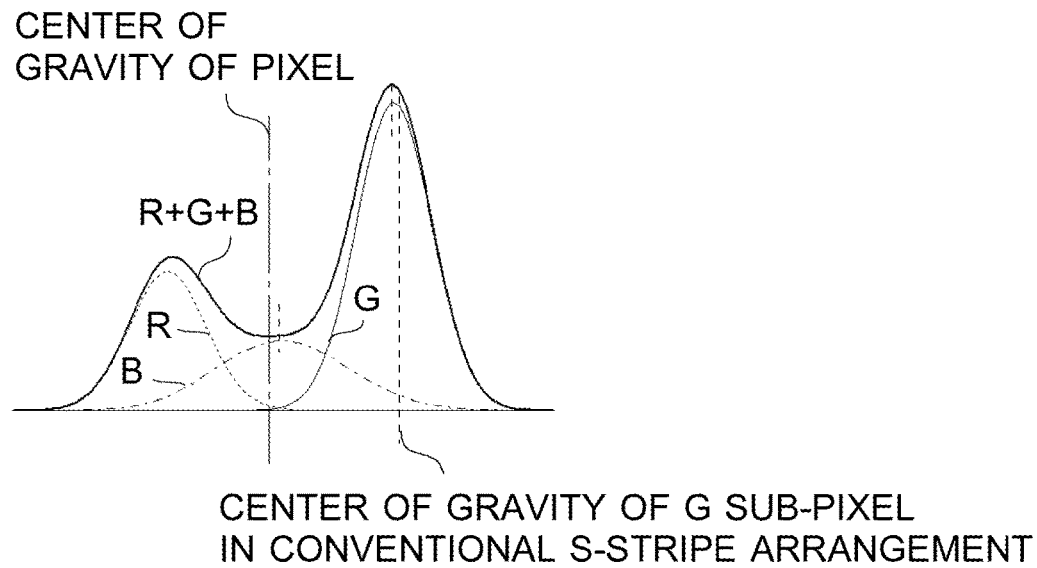
Figure 21B:
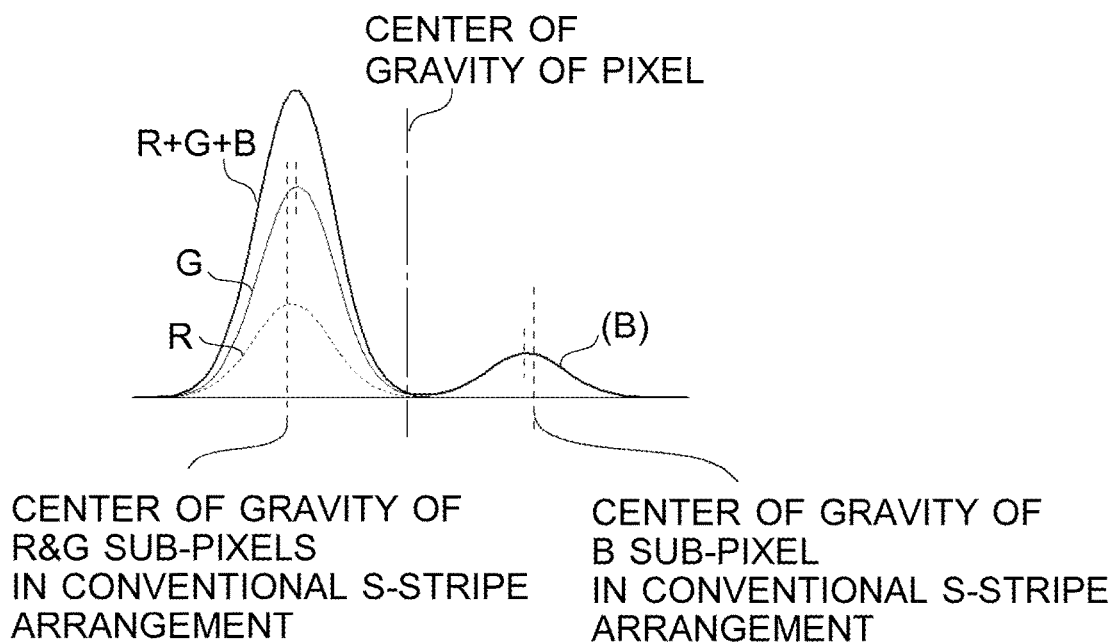
Figure 22:
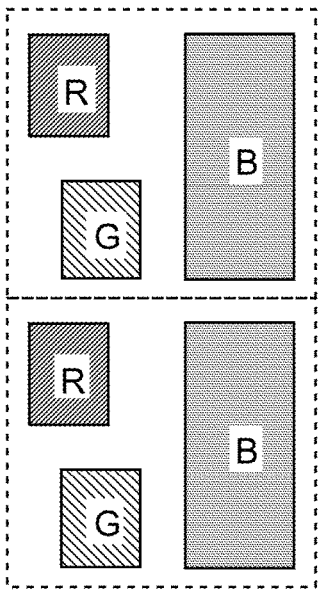
Figure 23:
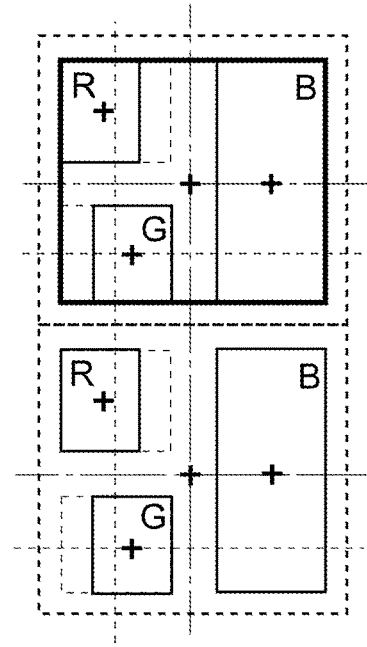
Figure 23:
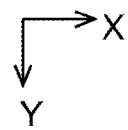
Figure 24A:
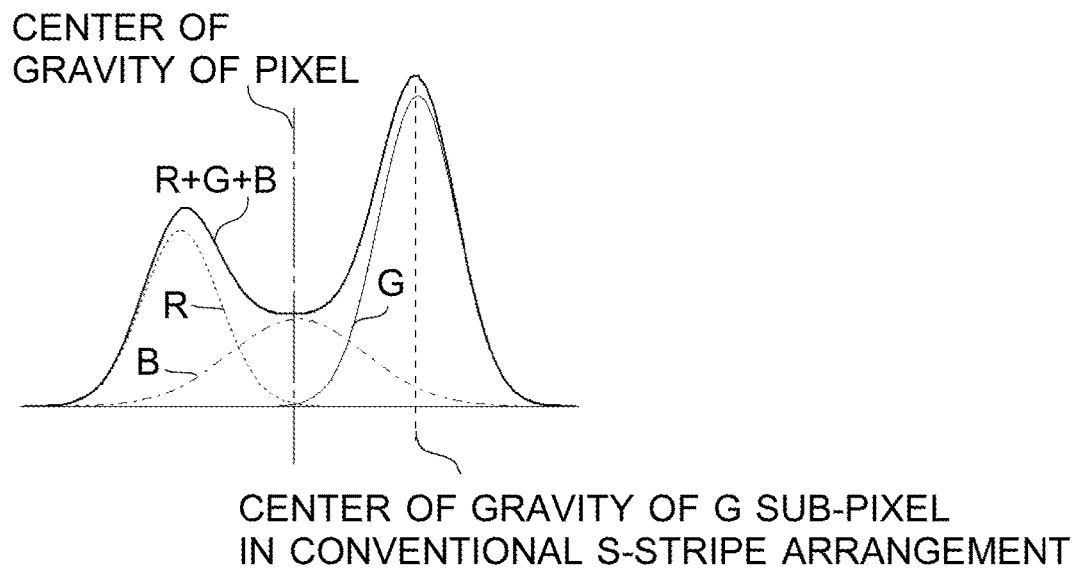
Figure 24B:
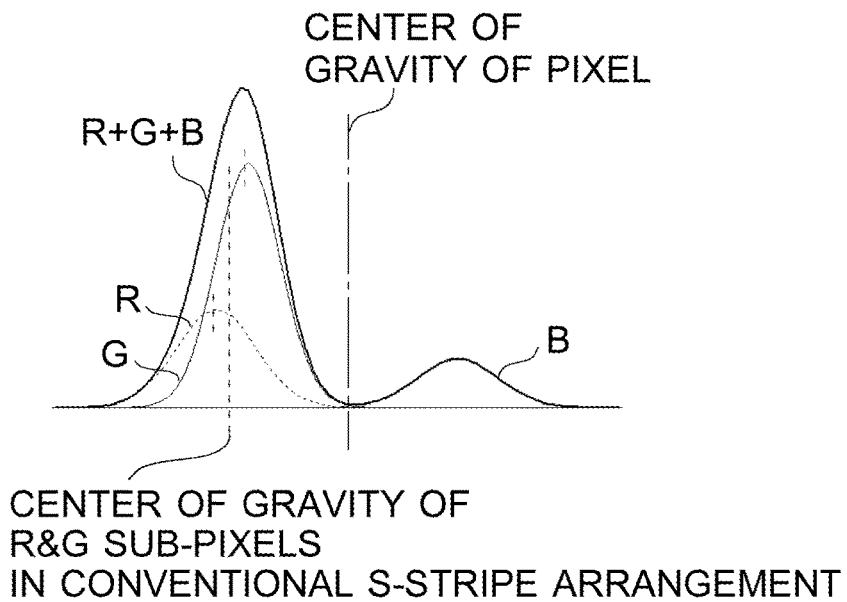
Figure 25:
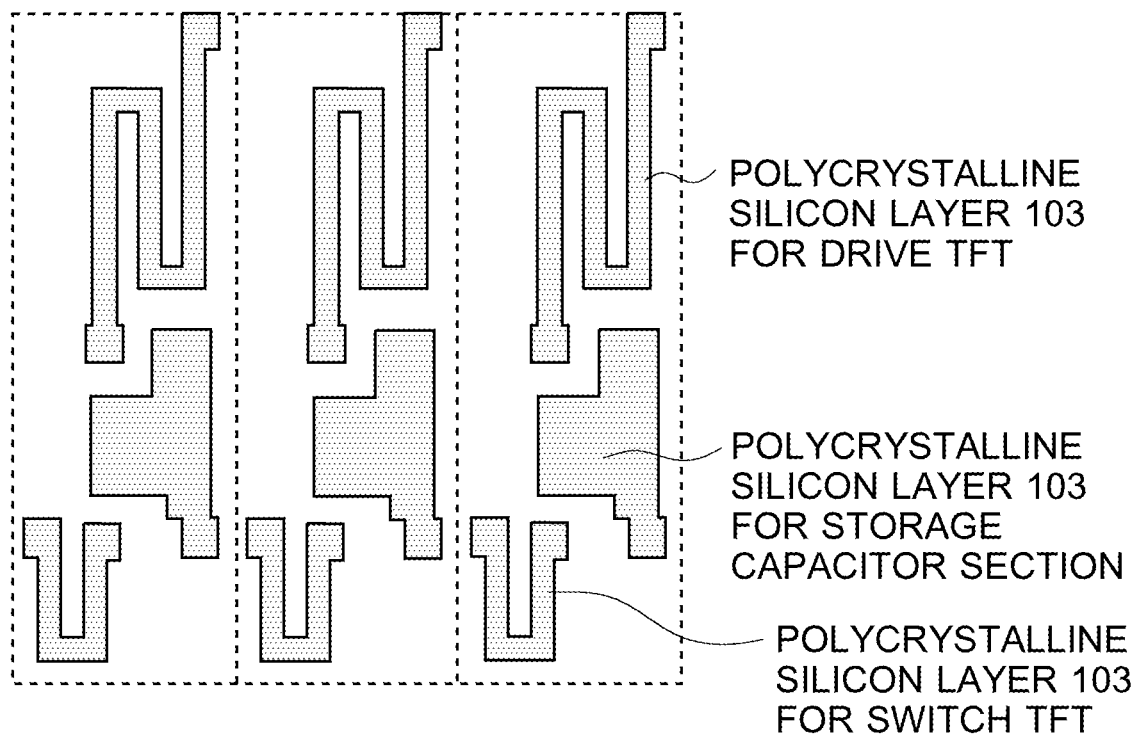
Figure 26:
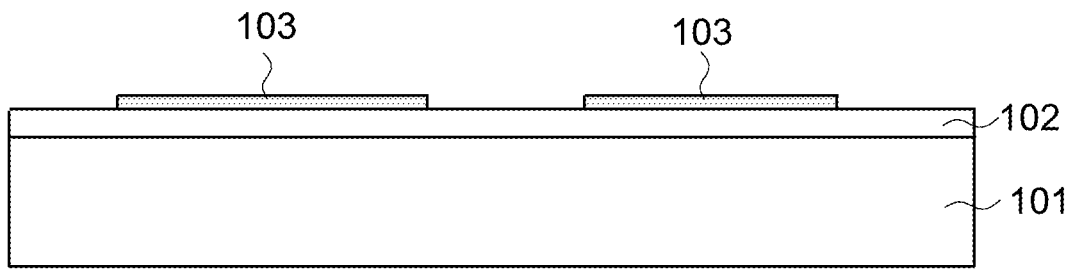
Figure 27:
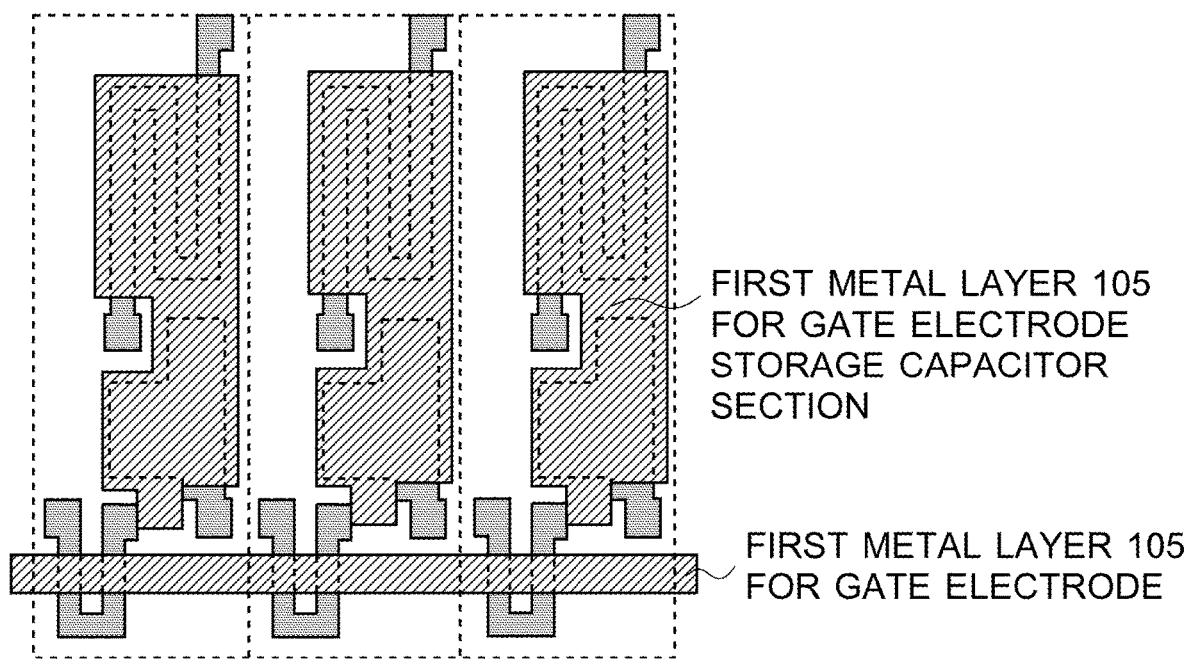
Figure 28:
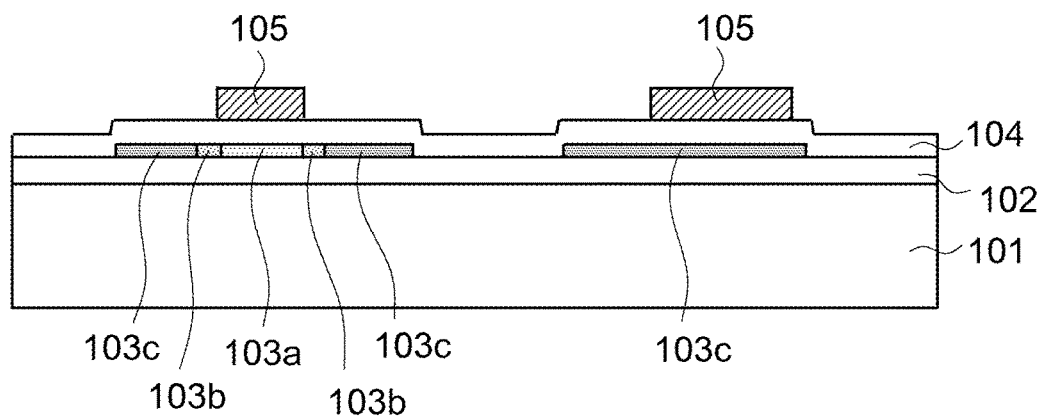
Figure 29:
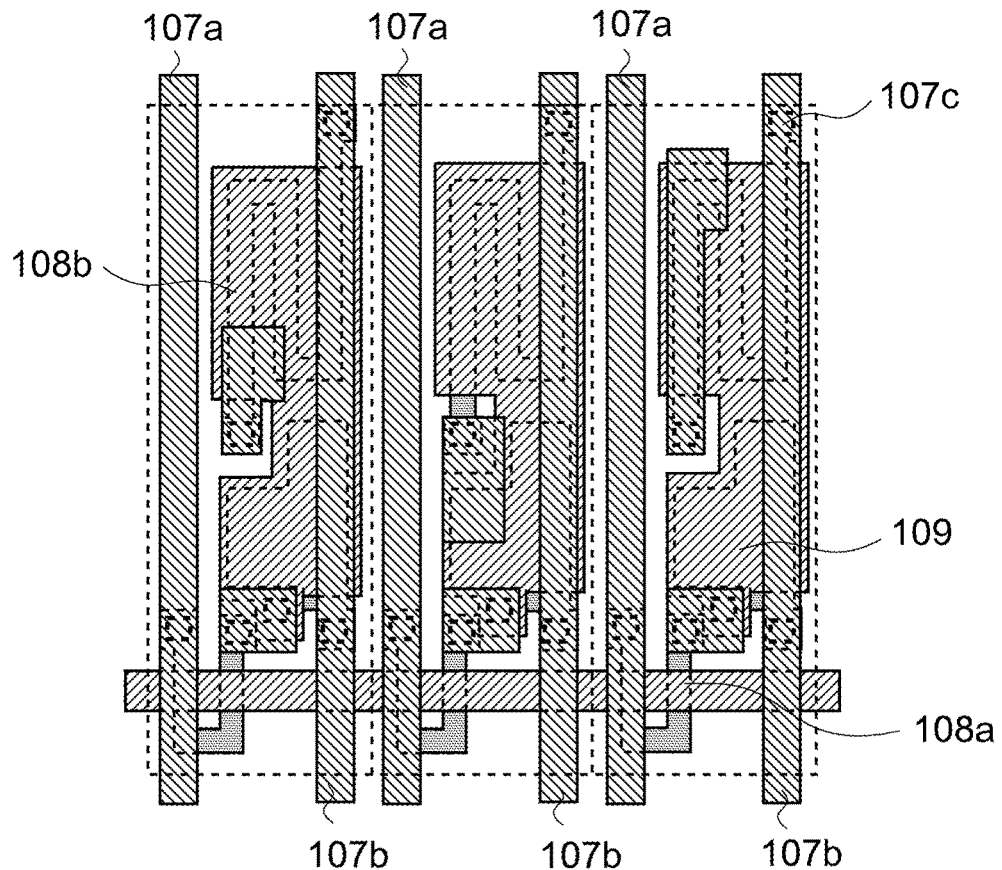
Figure 30:
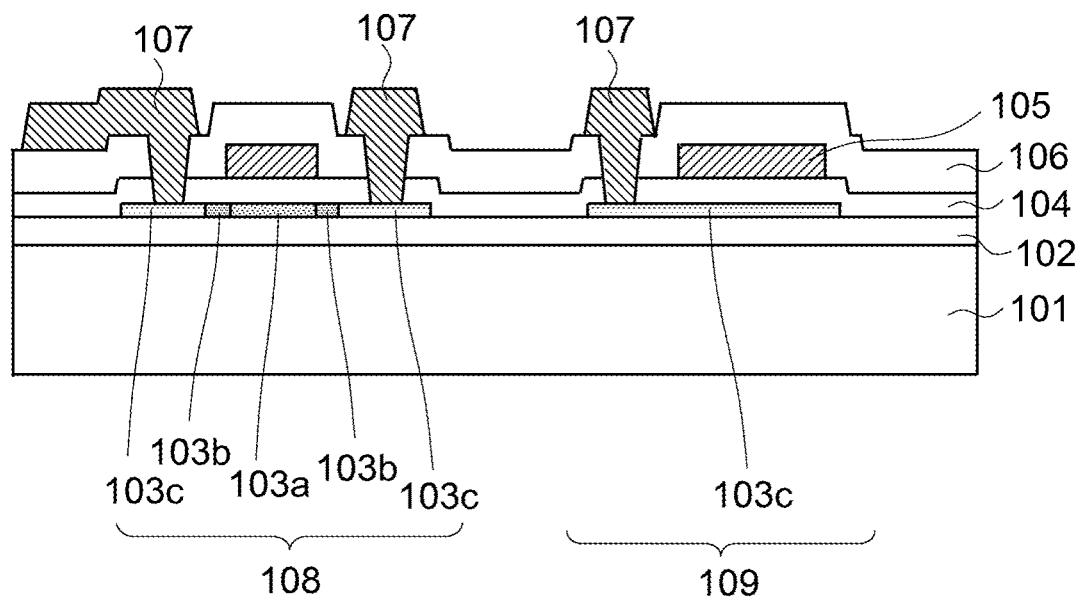
Figure 31:
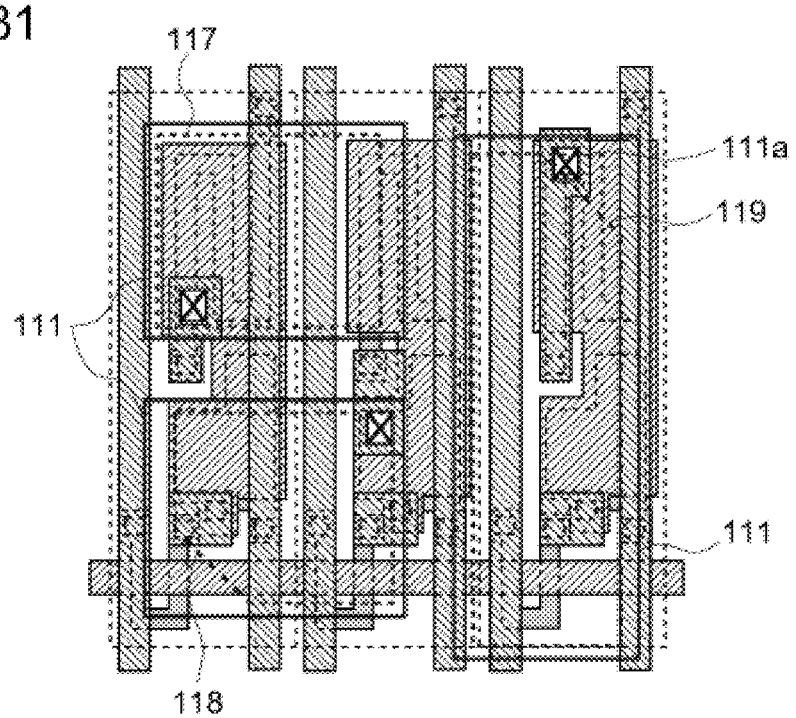
Figure 32:
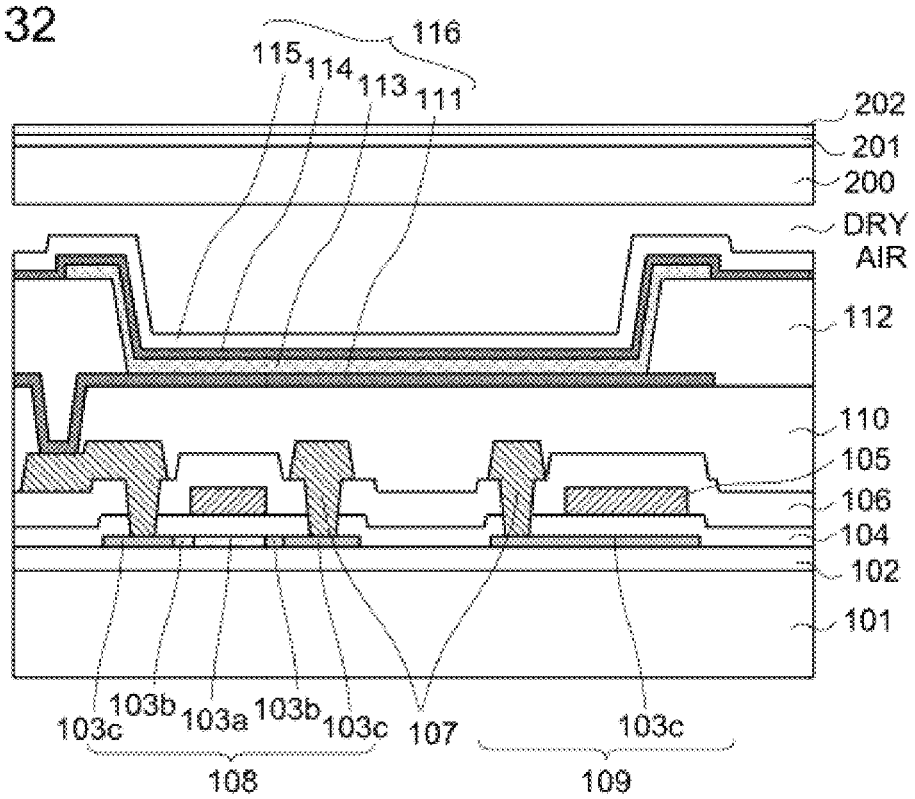
Figure 33:
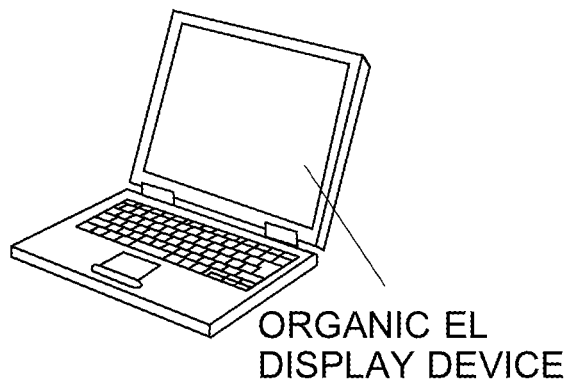
Figure 34:
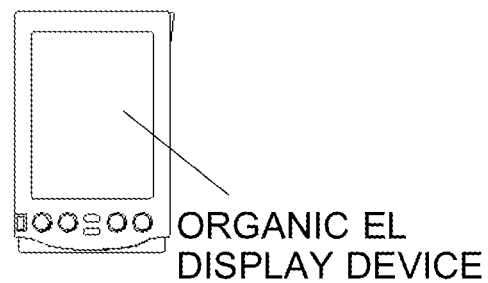
Figure 35:
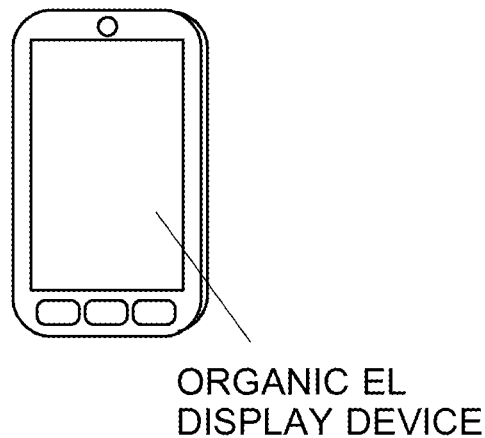
Figure 36:
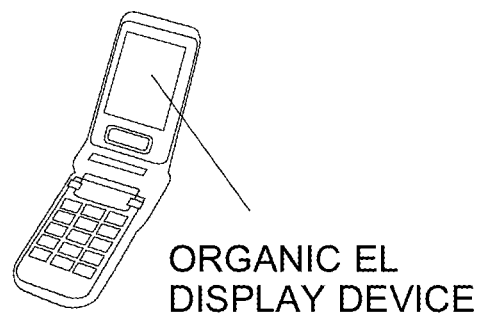
Figure 37:
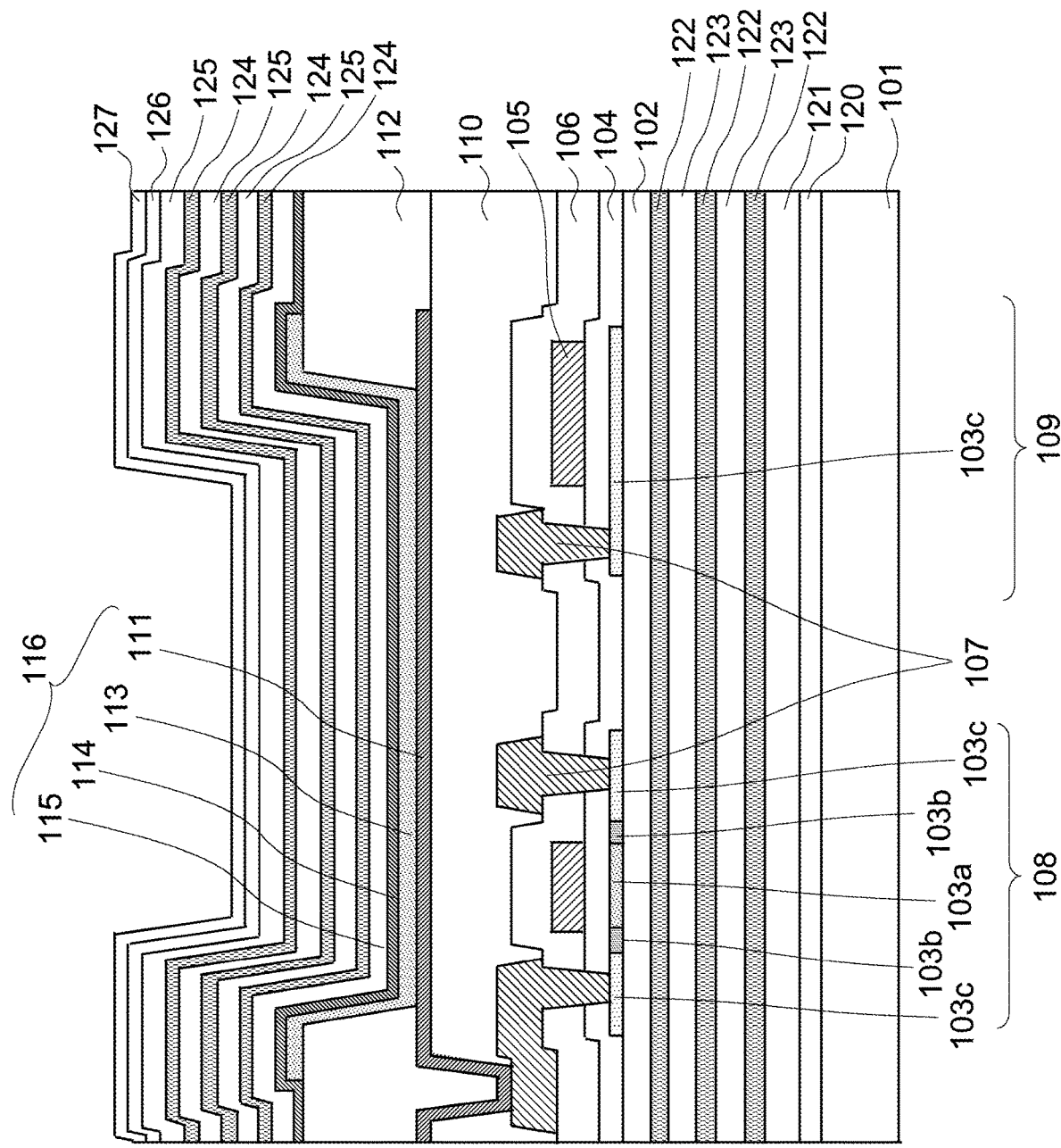
Figure 38:
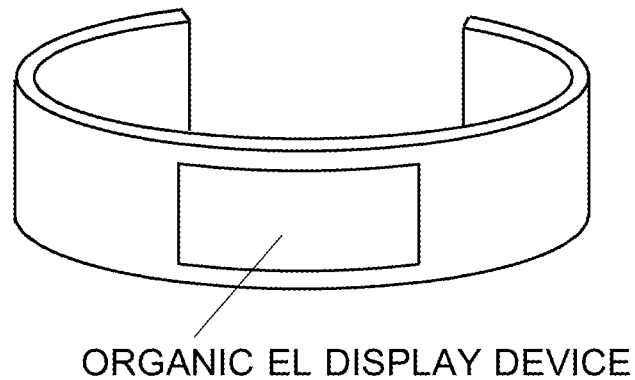
Figure 39:
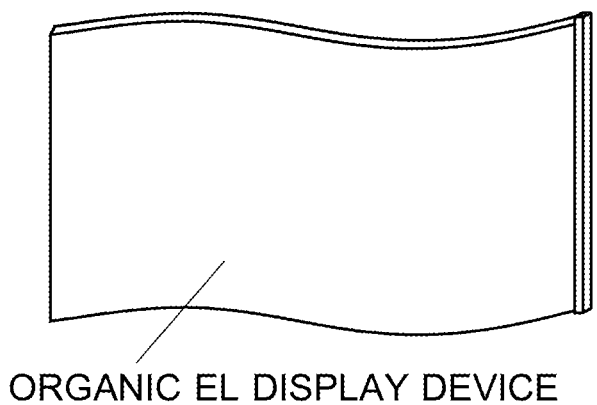
Figure 40:
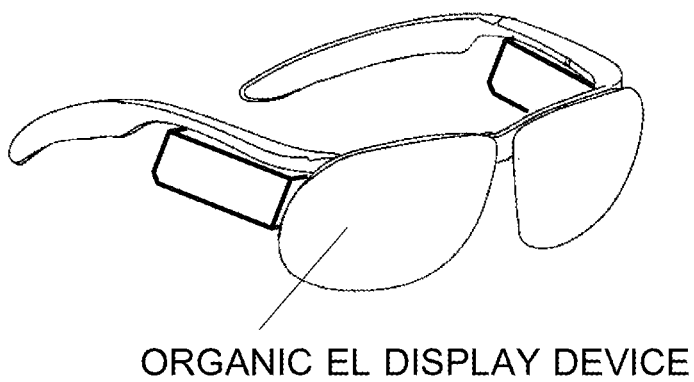
Figure 41:
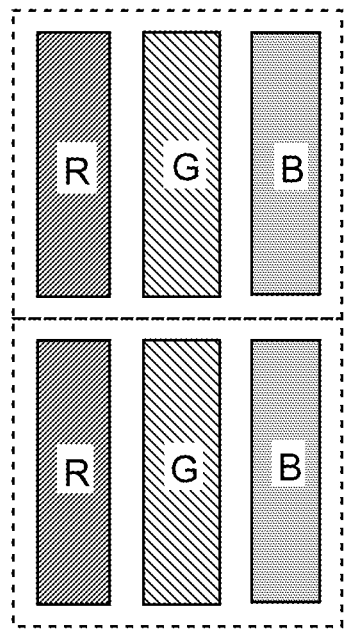
Figure 42:
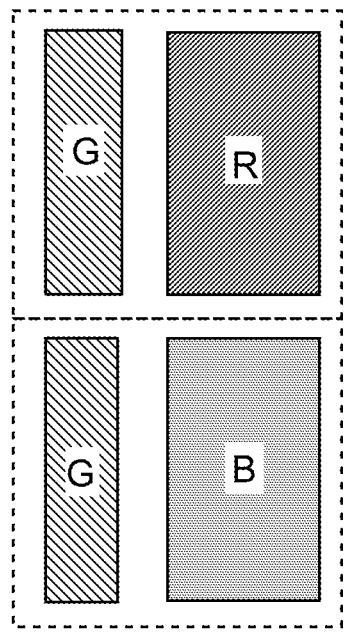
Figure 43:
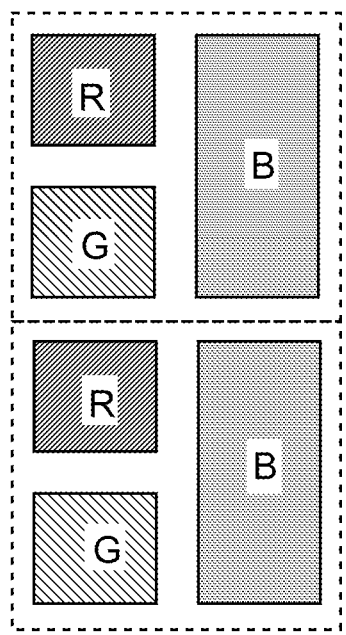

Each of FIGS. 9A and 9B is a spatial distribution diagram of the relative luminosities of the conventional pixel array structure in the S-stripe arrangement;

FIG. 10 is a plan view illustrating a pixel array structure in the S-stripe arrangement (pattern 1) as one embodiment of the present invention;

FIG. 11 is a plan view illustrating a positional relationship of subpixels in the pixel array structure in the S-stripe arrangement (pattern 1) as one embodiment of the present invention;

Each of FIGS. 12A and 12B is a spatial distribution diagram of the relative luminosities of the pixel array structure in the S-stripe arrangement (pattern 1) as one embodiment of the present invention;

FIG. 13 is a plan view illustrating a pixel array structure in the S-stripe arrangement (pattern 2) as one embodiment of the present invention;

FIG. 14 is a plan view illustrating a positional relationship of subpixels in the pixel array structure in the S-stripe arrangement (pattern 2) as one embodiment of the present invention;

Each of FIGS. 15A and 15B is a spatial distribution diagram of the relative luminosities of the pixel array structure in the S-stripe arrangement (pattern 2) as one embodiment of the present invention;

FIG. 16 is a plan view illustrating a pixel array structure in the S-stripe arrangement (pattern 3) as one embodiment of the present invention;

FIGS. 17A and 17B are plan views illustrating a positional relationship of subpixels in the pixel array structure in the S-stripe arrangement (pattern 3) as one embodiment of the present invention;

Each of FIGS. 18A and 18B is a spatial distribution diagram of the relative luminosities of the pixel array structure in the S-stripe arrangement (pattern 3) as one embodiment of the present invention;

FIG. 19 is a plan view illustrating a pixel array structure in the S-stripe arrangement (pattern 4) as one embodiment of the present invention;

FIG. 20 is a plan view illustrating a positional relationship of subpixels in the pixel array structure in the S-stripe arrangement (pattern 4) as one embodiment of the present invention;

Each of FIGS. 21A and 21B is a spatial distribution diagram of the relative luminosities of the pixel array structure in the S-stripe arrangement (pattern 4) as one embodiment of the present invention;

FIG. 22 is a plan view illustrating a pixel array structure in the S-stripe arrangement (pattern 5) as one embodiment of the present invention;

FIG. 23 is a plan view illustrating a positional relationship of subpixels in the pixel array structure in the S-stripe arrangement (pattern 5) as one embodiment of the present invention;

Each of FIGS. 24A and 24B is a spatial distribution diagram of the relative luminosities of the pixel array structure in the S-stripe arrangement (pattern 5) as one embodiment of the present invention;

FIG. 25 is a plan view for illustrating a production process (the first process) of an organic EL display device of EXAMPLE 1;

FIG. 26 is a cross-sectional view for illustrating a production process (the first process) of an organic EL display device of EXAMPLE 1;

FIG. 27 is a plan view for illustrating a production process (the second process) of an organic EL display device of EXAMPLE 1;

FIG. 28 is a cross-sectional view for illustrating a production process (the second process) of an organic EL display device of EXAMPLE 1;

FIG. 29 is a plan view for illustrating a production process (the third process) of an organic EL display device of EXAMPLE 1;

FIG. 30 is a cross-sectional view for illustrating a production process (the third process) of an organic EL display device of EXAMPLE 1;

FIG. 31 is a plan view for illustrating a production process (the fourth process) of an organic EL display device of EXAMPLE 1;

FIG. 32 is a cross-sectional view for illustrating a production process (the fourth process) of an organic EL display device of EXAMPLE 1;

FIG. 33 is a schematic diagram illustrating an example of an application of an organic EL display device of EXAMPLE 2;

FIG. 34 is a schematic diagram illustrating another example of an application of an organic EL display device of EXAMPLE 2;

FIG. 35 is a schematic diagram illustrating another example of an application of an organic EL display device of EXAMPLE 2;

FIG. 36 is a schematic diagram illustrating another example of an application of an organic EL display device of EXAMPLE 2;

FIG. 37 is a cross-sectional view schematically illustrating a structure of an organic EL display device of EXAMPLE 3;

FIG. 38 is a schematic diagram illustrating an example of an application of an organic EL display device of EXAMPLE 3;

FIG. 39 is a schematic diagram illustrating an example of an application of an organic EL display device of EXAMPLE 3;

FIG. 40 is a schematic diagram illustrating another example of an application of an organic EL display device of EXAMPLE 3;

FIG. 41 is a plan view schematically illustrating a conventional pixel array structure (in the RGB vertical stripe arrangement) of an organic EL display device;

FIG. 42 is a plan view schematically illustrating a conventional pixel array structure (the PenTile arrangement) of an organic EL display device; and FIG. 43 is a plan view schematically illustrating a conventional pixel array structure (the S-stripe arrangement) of an organic EL display device.

DETAILED DESCRIPTION

Illustrative pixel arrays, electro-optic devices equipped with the pixel array, and electric apparatuses employing the electro-optic device as a display unit will be described below as embodiments of the present invention with reference to the drawings. It will be appreciated by those of ordinary skill in the art that the description given herein with respect to those figures is for exemplary purposes only and is not intended in any way to limit the scope of potential embodiments may be resolved by referring to the appended claims.

According to the illustrative pixel array, in the S-stripe arrangement which of arranging R sub-pixels and G sub-pixels in the same column and B sub-pixels in a column next to the column of the R and G sub-pixels so as to be arranged in same raw with pairs of R and G sub-pixels, the sub-pixels in one pixel having a rectangular shape are arranged as follows. The center of gravity of a sub-pixel emitting light of the color of the maximum relative luminosity and/or the center of gravity of a sub-pixel emitting light of the color of the minimum relative luminosity is made to come near to the center of gravity of the pixel. Alternatively, a part of a sub-pixel emitting light of the color of the maximum relative luminosity, which is opposite to another part facing the center of gravity of the pixel (or is located farther from the center of gravity of a pixel), is trimmed, and/or a corner part, which is diagonally opposite the sub-pixel in the color of the maximum relative luminosity, of the sub-pixel in the color of the minimum relative luminosity is trimmed. These arrangements make the both peaks of the spatial distributions of relative luminosity corresponding to the G sub-pixel of the color of the maximum relative luminosity and the B sub-pixel of the color of the minimum relative luminosity approach each other and can soften unbalance of the relative luminosities spatial distribution in a pixel. Further, an electro-optic device using the pixel array and an electric apparatus employing the electro-optic device as a display unit, are capable of reducing a visibility of color fringing at an edge of an image and enhancing their display quality.

In pixels using the RGB vertical stripe arrangement, for example, as shown in FIG. 41, vertically-elongated sub-pixels in three colors of R, G, and B are arranged side by side transversely. However, with an enhancement in definition of organic EL display devices, it becomes difficult to deposit sub-pixels separately with organic materials for three colors of R, G, and B by using a FMM. In view of such a problem, there has been proposed a PenTile arrangement in which each pixel is composed of G and R sub-pixels or G and B sub-pixels as shown in FIG. 42. In the PenTile arrangement, the width of each of the R and B sub-pixels can be made twice that in RGB vertical stripe arrangement. Accordingly, this arrangement has an advantage of making a process of depositing the sub-pixels separately with a FMM easier even in a pixel array structure for high definition. However, the PenTile arrangement is aimed at softening a lack of color reproduction coming from the reduction of sub-pixels by using software processing so as to display an image in which human eyes do not perceive any problems. Such an arrangement will cause defects such that jaggies which are consciously-jagged edges appear at an edge in an image, or color gradation is perceived as colored lines.

From such a circumstance, there has been proposed an S-stripe arrangement where R sub-pixels and G sub-pixels are arranged alternately in the same column and B subpixels are arranged on a column next to the column of R and G sub-pixels so as to be arrayed in a raw together with pairs of R and G sub-pixels in a pixel, as illustrated by FIG. 43. In this S-stripe arrangement, the width of sub-pixels can be made wider than those of the RGB vertical stripe arrangement, and an aperture size of the FMM can be made larger. Further, since RGB sub-pixels are arranged in each pixel, the S-stripe arrangement can provide an enhanced display quality in comparison to the PenTile arrangement.

However, in the both of the PenTile arrangement and the S-stripe arrangement, a G sub-pixel which emits light of color being the maximum in relative luminosity is arranged at an edge or corner of each pixel. Accordingly, unbalance in relative luminosities within a pixel becomes large, and it results in a visibility of color fringing which is a phenomenon that an edge in an image is observed as being colored. In particular, in the S-stripe arrangement, since a G sub-pixel is located at the farthest position from the center of gravity of a pixel when being viewed along a diagonal line which does not pass the G sub-pixel, the unbalance in relative luminosities become remarkable, and deterioration of display quality coming from the visibility of color fringing becomes a large problem.

In view of that, one embodiment of the present invention provides a pixel array structure employing the S-stripe arrangement which can maximize the aperture ratio of a FMM with respect to the native resolution, and in the pixel array structure, positions and shapes of sub-pixels in a pixel are defined such that a G sub-pixel is arranged equivalently near to the center of a pixel. As a result, unbalance in relative luminosities within one pixel is reduced, and a visibility of color fringing is restricted. For example, a part of a G sub-pixel located farther from the center of gravity of a pixel (the part opposite to another part of the G sub-pixel facing the center of gravity of the pixel) is trimmed, or a part of a B sub-pixel located far from the center of gravity of a pixel (the part opposite to another part of the B sub-pixel facing the center of gravity of the pixel) is trimmed. Such an arrangement makes the peaks of the spatial distribution of relative luminosity corresponding to a G sub-pixel and a B sub-pixel approach each other, when being viewed along a vertical line, a horizontal line, and a line in the diagonal direction which does not pass the G sub-pixel, which makes possible to reduce unbalance in the spatial distribution of relative luminosities within a pixel and to reduce a visibility of color fringing. Further, these colors can be mixed in a good condition along a line at any angle, and color recognizability for a fine pattern can be enhanced.

Hereinafter, description about the present embodiment will be given in detail with reference to drawings. In this specification, an electro-optics element means a general electronic device configured to change an optical state of light by an electric action, and such electro-optics elements include an electronic element configured to offer gradation display capability by changing a polarizing state of light, such as a liquid crystal element, as well as a self-light-emitting element such as an organic EL element. Further, an electro-optic apparatus is a display apparatus configured to offer display capability by using an electro-optics element. In the present embodiment, an organic EL element is preferably used. An organic EL element serves as a current-driven self-light-emitting element configured to emit light by itself with current drive. Accordingly, hereafter, description is given based on the assumption that an organic EL element is used as a light emitting element.

Figure 1:
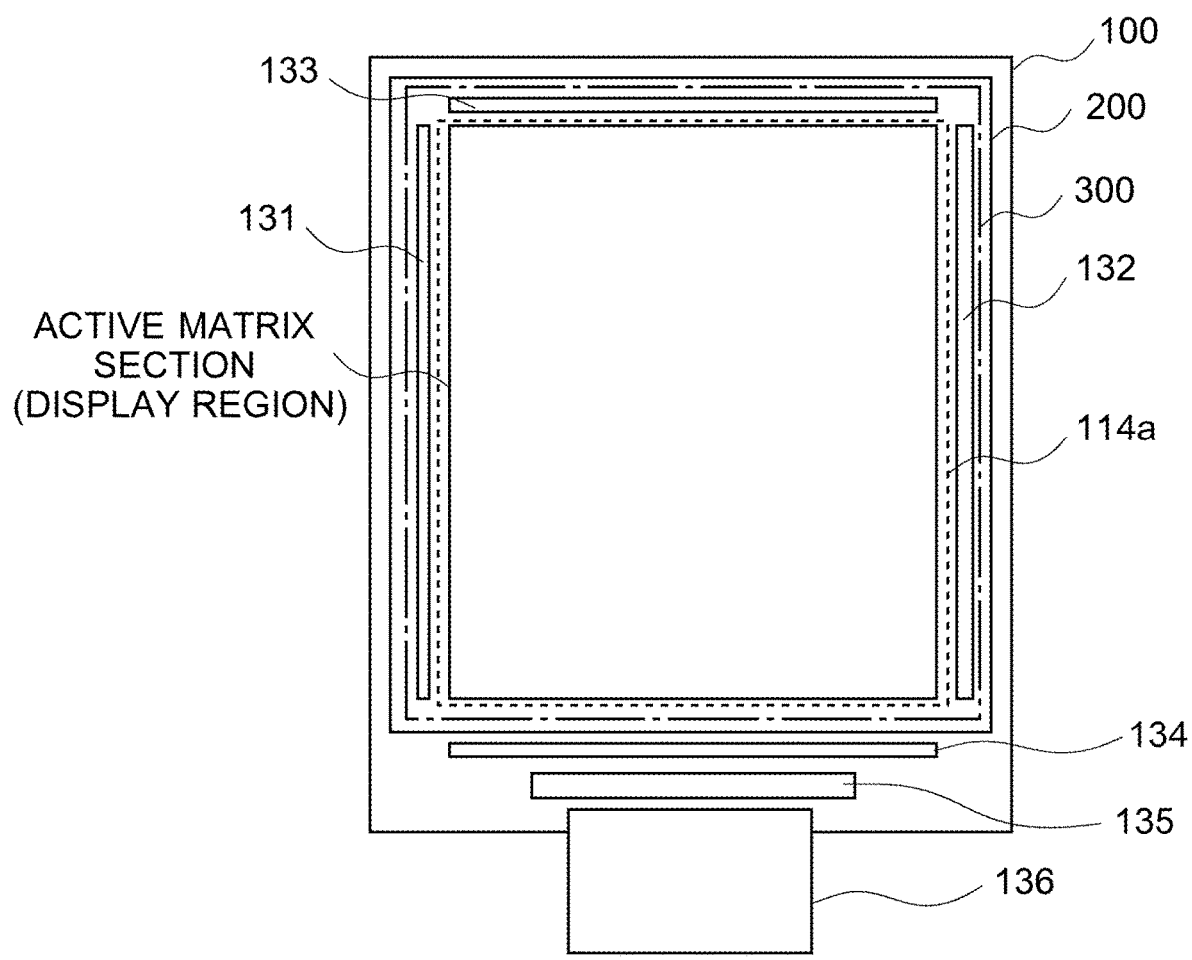
FIG. 1 is a plan view of an organic EL display device as one embodiment of the present invention.

FIG. 1 illustrates an organic EL display device as one example of an electro-optic apparatus as an embodiment of the present invention. This organic EL display device can be roughly divided into the following components: a TFT (Thin-Film Transistor) substrate 100 on which a light emitting element is formed; a sealing glass substrate 200 to seal the light emitting element; and a joining member (glass frit seal portion) 300 to join the TFT substrate 100 and the sealing glass substrate 200. The TFT substrate 100 includes a display region (an active matrix section) and a cathode electrode forming region 114a formed by a vapor deposition method at the outside of the display region. On the periphery of the cathode electrode forming region 114a, there are arranged a scanning driver 131 (a TFT circuit) to drive scanning lines of the TFT substrate 100; an emission control driver 132 (a TFT circuit) to control a light emission period or light luminescence period of each pixel; a data-line ESD (Electro Static Discharge) protecting circuit 133 to prevent breakage caused by electrostatic discharge; a demultiplexer 134 (1-to-n demultiplexer being an analog switch TFT) to return a stream with a high transfer rate to multiple streams with an original low transfer rate; and a data driver IC 135 which is mounted by using an anisotropic electric conductive film (ACF) and is configured to drive data lines. Those components are connected to an external device via a FPC (Flexible Printed Circuit) 136. The apparatus shown in FIG. 1 is one example of the organic EL display device of the present embodiment, and its configuration and constitution can be modified appropriately.

Figure 2:
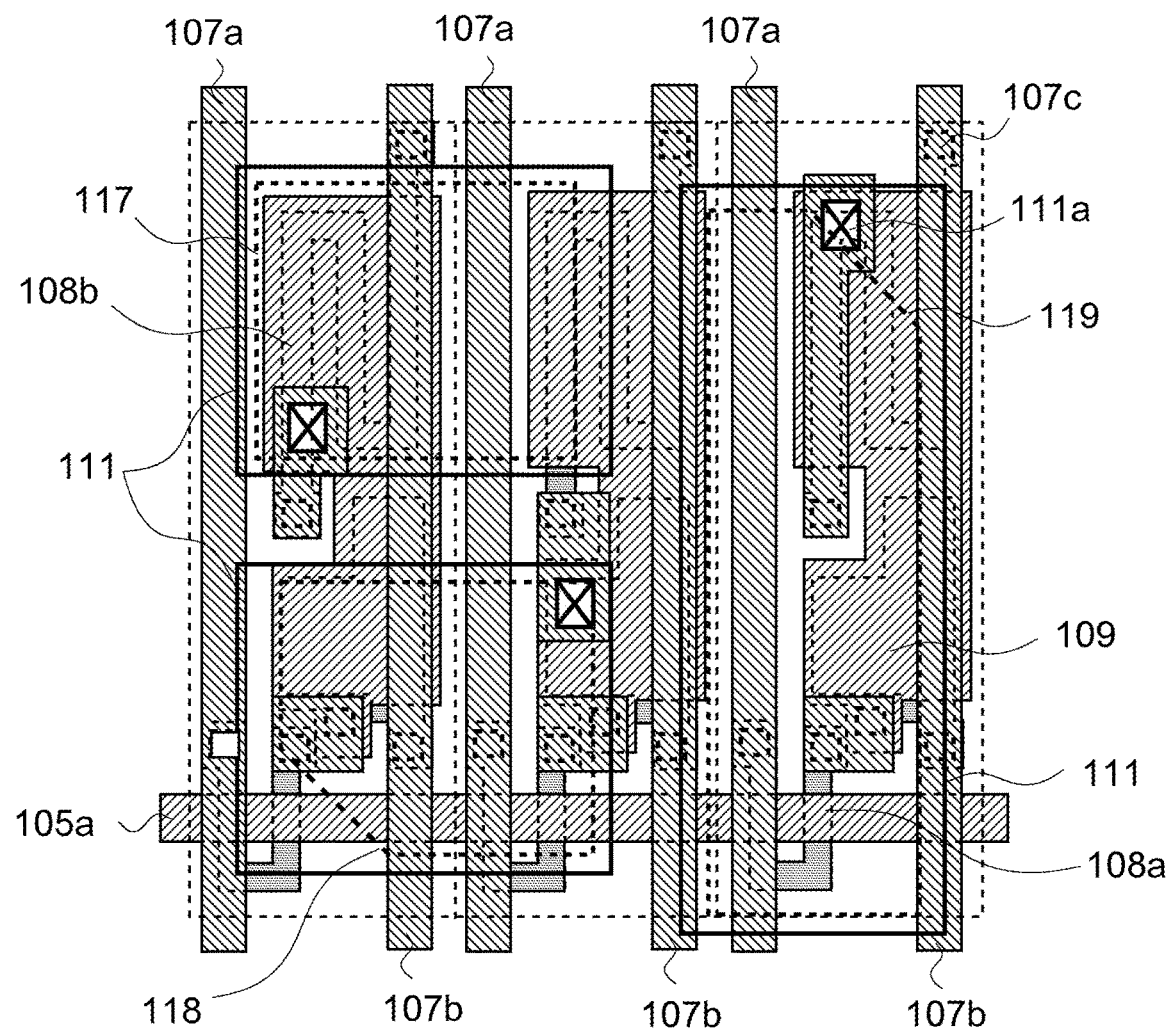
FIG. 2 is a plan view schematically illustrating the constitution of a pixel (corresponding to three sub-pixels) of an organic EL display device as one embodiment of the present invention.
Figure 3:
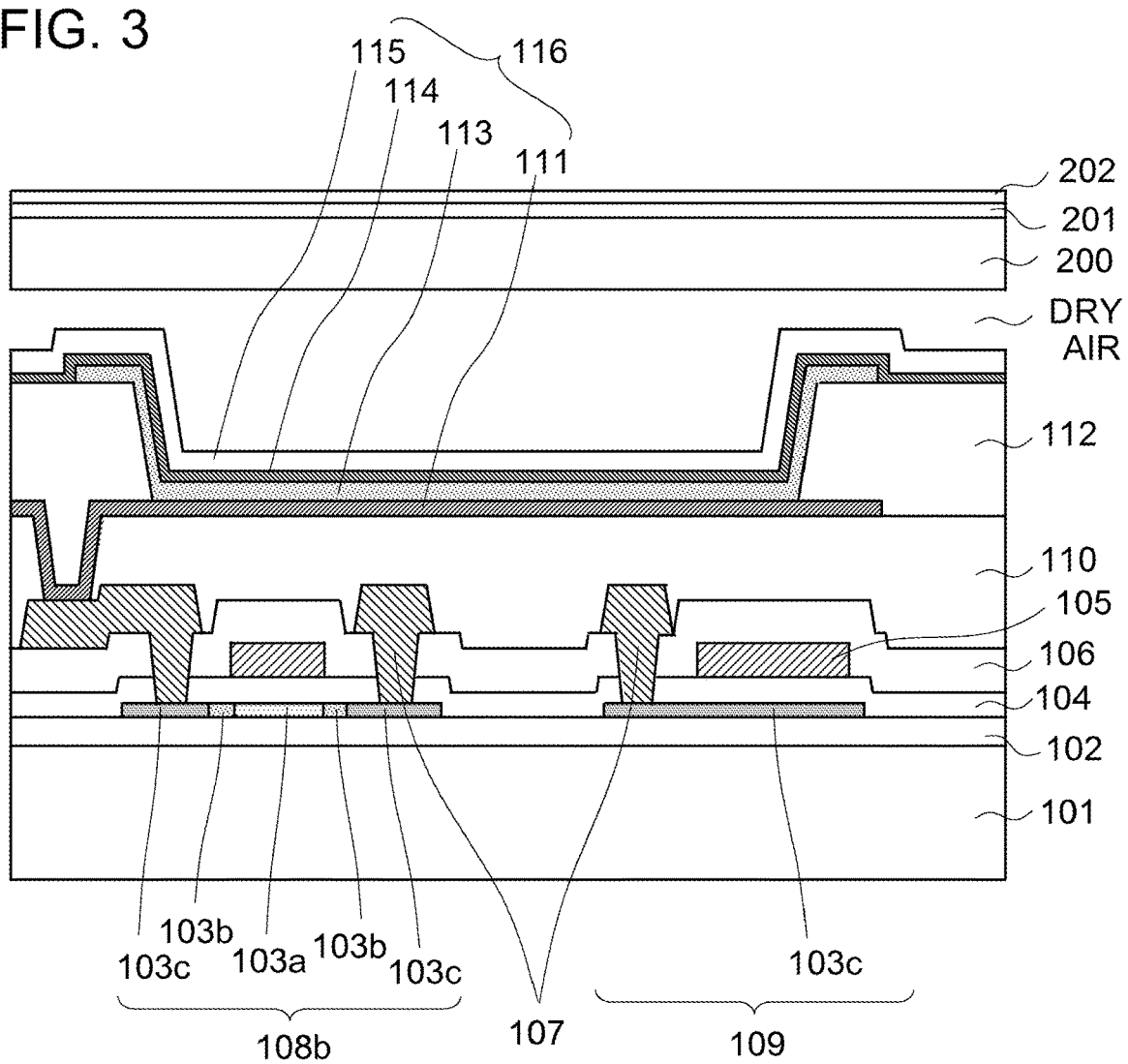
FIG. 3 is a cross-sectional view schematically illustrating the constitution of a pixel (corresponding to one sub-pixel) of an organic EL display device as one embodiment of the present invention.

FIG. 2 is a plan view of a light emitting element formed on the TFT substrate 100, for specifically illustrating the partial constitution of the light emitting element corresponding to a single pixel (composed of three sub-pixels). The illustrated pixel is repeatedly formed in both the extending direction of data lines and the extending direction of scanning lines (gate electrodes) on the TFT substrate 100. FIG. 3 is a cross-sectional view of the light emitting element, for specifically illustrating the partial constitution of the light emitting element corresponding to a single sub-pixel. In FIG. 3, for easy understanding of the constitution of a sub-pixel of the present embodiment, a region including a drive TFT 108b and a storage capacitor section 109 in the plan view of FIG. 2 is extracted and depicted with simplification.

The TFT substrate 100 includes a glass substrate 101, and polycrystalline silicon layers (i-polycrystalline silicon layer 103a, p− polycrystalline silicon layer 103b, and p+ polycrystalline silicon layer 103c) which is formed of a low-temperature polycrystalline silicon (LTPS) on the glass substrate 101 with a base insulating film 102 put between them. The TFT substrate 100 further includes a first metal layer 105 (including a gate electrodes 105a and a storage capacitor electrodes 105b) which are formed on the polycrystalline silicon layer with a gate insulating film 104 put between the first metal layer 105 and the polycrystalline silicon layer; and a second metal layer 107 (including data lines 107a, power-supply lines 107b, source/drain electrodes, and first contact sections 107c) connected to the polycrystalline silicon layer via holes formed in an interlayer insulating film 106. The TFT substrate 100 further includes light emitting elements 116 (including anode electrodes 111, an organic EL (electroluminescence) layer 113, cathode electrodes 114, and a cap layer 115) formed with a flattened film 110 put between the light emitting elements 116 and the above-described components.

Dry air is encapsulated in a space between the light emitting elements 116 and the sealing glass substrate 200, and the space is sealed with the glass frit seal portion 300, whereby an organic EL display device is formed. The light emitting elements 116 have a top-emission structure. There is a predetermined gap between the light emitting elements 116 and the sealing glass substrate 200, and a λ/4 (quarter wavelength) retardation plate 201 and a polarization plate 202 are formed at the light-outgoing-surface side of the sealing glass substrate 200 so as to reduce the reflection of incident light rays from the outside.

In FIG. 2, a single pixel is constituted by three regions each of which is sandwiched between a data line 107a and a power-supply line 107b which face each other. In each of the three regions, a switch TFT 108a (a TFT section), a drive TFT 108b (a TFT section), and a storage capacitor section 109 are disposed. In FIG. 2, a data line 107a for a R sub-pixel, a data line 107a for a G sub-pixel, a data line 107a for a B sub-pixel are arranged in order from left to right; and a power-supply line 107b for a R sub-pixel, a power-supply line 107b for a G sub-pixel, and a power-supply line 107b for a B sub-pixel are arranged in order from left to right. If pixels are arranged in the RGB vertical stripe arrangement, anode electrodes 111 are formed separately on the above three regions, and the light emitting element 116 formed in each of the three regions should be driven by using a switch TFT 108a, a drive TFT 108b, and a storage capacitor section 109 in a corresponding region of the three regions. However, in this embodiment, in order to realize a pixel array structure in the S-stripe arrangement by using a similar pixel constitution as the RGB vertical stripe arrangement, each of the anode electrodes 111 of the R sub-pixel and the G sub-pixel is formed so as to straddle over the two regions.

Concretely, with regard to B sub-pixel for emitting light of color which is the minimum in relative luminosity, an anode electrode 111 (indicated with a thick continuous line in FIG. 2) is formed in a vertically-elongated shape mainly along a data line 107a for the B sub-pixel and a power-supply line 107b for the B sub-pixel, and a light emitting element 116 emits light in a B-luminescent region 119 (indicated with a thick broken line in FIG. 2) located in the right part of FIG. 2. On the other hand, with regard to the R sub-pixel, an anode electrode 111 is formed in a rectangular shape on the upper half portion of a region located to straddle over from a data line 107a of for the R sub-pixel to a power-supply line 107b for the G sub-pixel, and a light emitting element 116 emits light in a R-luminescent region 117 located at the left upper part of FIG. 2. Further, with regard to the G sub-pixel for emitting light of color which is the maximum in relative luminosity, an anode electrode 111 is formed in a rectangular shape on the lower half portion of the region located straddle over from the data line 107a for the R sub-pixel to the power-supply line 107b for the G sub-pixel, and a light emitting element 116 emits light in a G-luminescent region 118 located in the left lower part of FIG. 2. Here, the color of the maximum relative luminosity and the color of the minimum relative luminosity in the present specification and claims are relative expressions, and the "maximum" and "minimum" are defined by comparing luminosities (sensitivities of the human eye) corresponding to colors of sub-pixels included in a single pixel.

In other words, the sub-pixel in each color is driven by using a switch TFT 108a, a drive TFT 108b, and a storage capacitor section 109 formed in a region surrounded with the data line 107a and power-supply line 107b for the corresponding color. The anode electrodes 111 for the R sub-pixel and the G sub-pixel are formed separately in the upper portion and the lower portion so as to straddle over both of a region surrounded with the data line 107a and power-supply line 107b for R sub-pixel and a region surrounded with the data line 107a and power-supply line 107b for G sub-pixel. Therefore, the second contact sections 111a each of which connects the anode electrode 111 and the source/drain electrode of the drive TFT 108b are arranged as illustrated in FIG. 2. The switch TFTs 108a have a dual gate structure as shown in FIG. 3 in order to restrict crosstalk coming from the data lines 107a. The drive TFTs 108b for converting voltage into electric current have a winding shape as shown in FIG. 2 in order to minimize variation in the production process, whereby a sufficient channel length is secured. Further, by extending the gate electrode of each drive TFT 108b so as to be used also as an electrode of the storage capacitor section 109, a sufficient storage capacitance can be secured within a limited area. Such a pixel structure allows enlargement of the light emitting (luminescence) region for each of the RGB colors, which reduces a current density per unit for obtaining a required luminance for each color and makes possible to prolong the life span of the light emitting elements.

FIG. 3 illustrates light emitting elements 116 having a top-emission structure in which light rays coming from the light emitting elements 116 go outside through the sealing glass substrate 200. Alternatively, the light emitting elements 116 may have a bottom-emission structure in which light rays go outside through the glass substrate 101.

Figure 4:
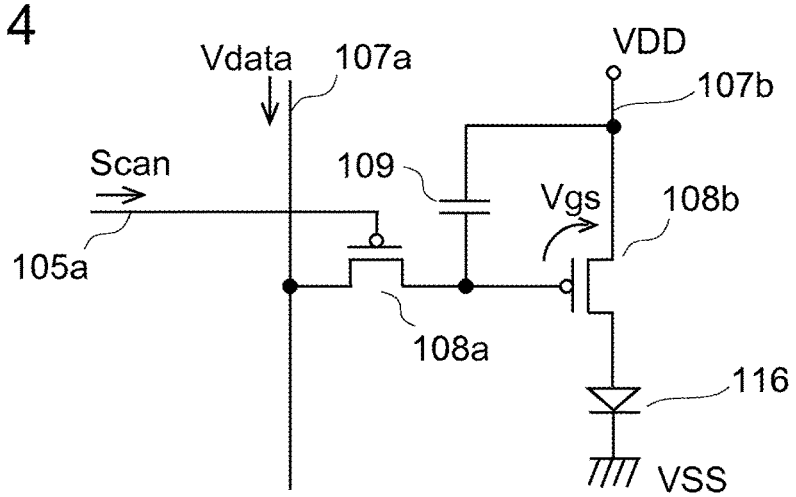
FIG. 4 is a diagram illustrating the constitution of a main circuit corresponding to a pixel of an organic EL display device as one embodiment of the present invention.
Figure 5:
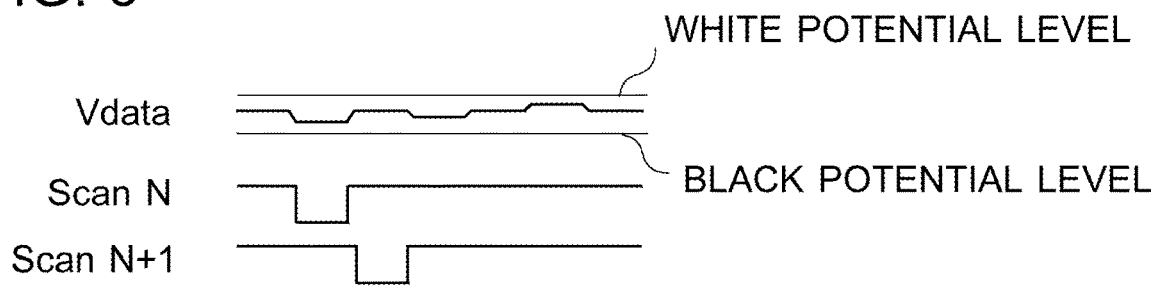
FIG. 5 is a diagram of waveforms for a pixel of an organic EL display device as one embodiment of the present invention.
Figure 6:
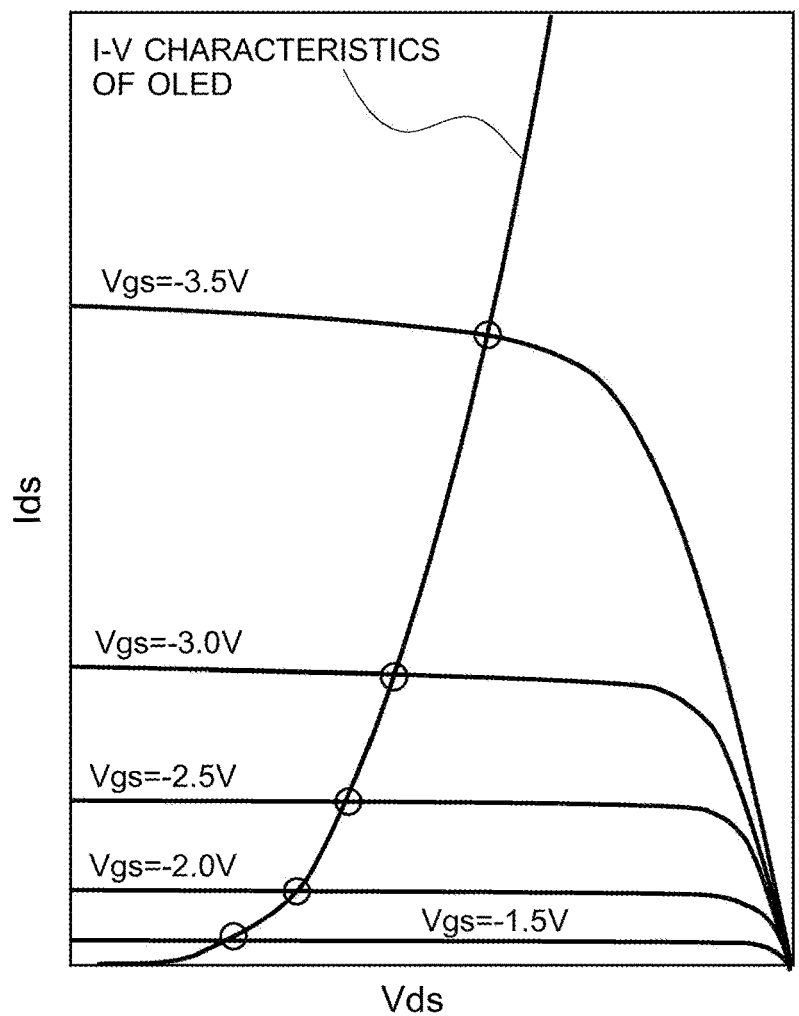
FIG. 6 is an output characteristic diagram of a drive TFT of an organic EL display device as one embodiment of the present invention.

Next, a method of driving each sub-pixel is described with reference to FIGS. 4 to 6. FIG. 4 is a constitution diagram of a main circuit of a sub-pixel, FIG. 5 is a waveform diagram, and FIG. 6 is an output characteristic diagram of a drive TFT 108b. Each sub-pixel is constituted by a switch TFT 108a which operates in a linear region, a drive TFT 108b which operates in a saturation region, a storage capacitor section 109, and a light emitting element 116 (OLED), and is driven and controlled by a two-transistor system. The switch TFT 108a is a p-channel type FET (Field Effect Transistor), a scanning line (gate electrode) 105a is connected to its gate terminal, and a data line 107a is connected to its drain terminal. The drive TFT 108b is a p-channel type FET, and its gate terminal is connected to the source terminal of the switch TFT 108a. Further, the source terminal of the drive TFT 108b is connected to a power-supply line 107b (or a positive supply VDD for anode drive), and its drain terminal is connected to the light emitting element 116 (OLED). Furthermore, the storage capacitor section 109 is formed between the gate and source of the drive TFT 108b. In FIG. 4, VSS represents a cathode (a negative supply).

In the above constitution, when a selection pulse being a scan signal (Scan in FIG. 4, and Scan N and Scan N+1 in FIG. 5) is output to a scanning line (gate electrode) 105a to make the switch TFT 108a into an open state, data signals (pixel signals) Vdata supplied through the data line 107a are written as voltage values in the storage capacitor section 109. Herein, the data signals Vdata are supplied as analog voltage, and their voltage values fall within the range between the white potential level which makes the maximum luminance and the black potential level which makes the minimum luminance. The stored voltage written in the storage capacitor section 109 is held through an one frame period, the conductance of the drive TFT 108b is changed in an analog manner by the stored voltage, and a forward bias current corresponding to a gradation level of the light emission (luminescence) is supplied to the light emitting element 116 (OLED).

FIG. 6 is a graph illustrating the relationship of a current between the drain and the source of the drive TFT 108b, in other words, a drive current Ids of the light emitting element 116 (OLED), and of the voltage between the drain and the source of drive TFT 108 bat each of the voltage values Vgs between the gate and the source of the drive TFT 108b: −1.5 V, −2.0 V, −2.5 V, −3.0 V, and −3.5 V. The graph further illustrates the I-V characteristics of the light emitting element 116. The output characteristic curve of the drive TFT 108b at each of the gate-source voltage values Vgs has a part where the values of Ids become almost the same irrespective of the values of Vds.

As can be seen from FIG. 6, the light emitting element 116 (OLED) is driven with a constant current, and thereby, the light emitting element 116 (OLED) can emit light while keeping the constant luminance even if its resistance changes due to the deterioration of itself. Accordingly, the above drive method is suitable as a method of driving the organic EL display device of the present embodiment.

Figure 7:
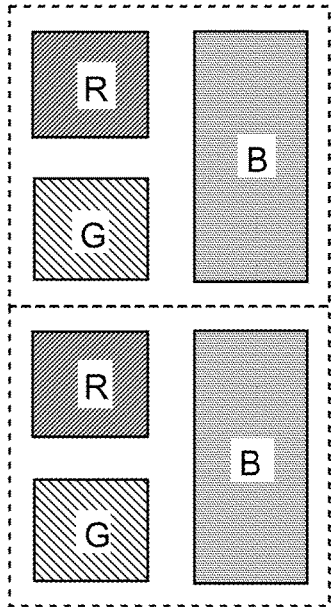
FIG. 7 is a plan view illustrating a conventional pixel array structure in the S-stripe arrangement.
Figure 8:
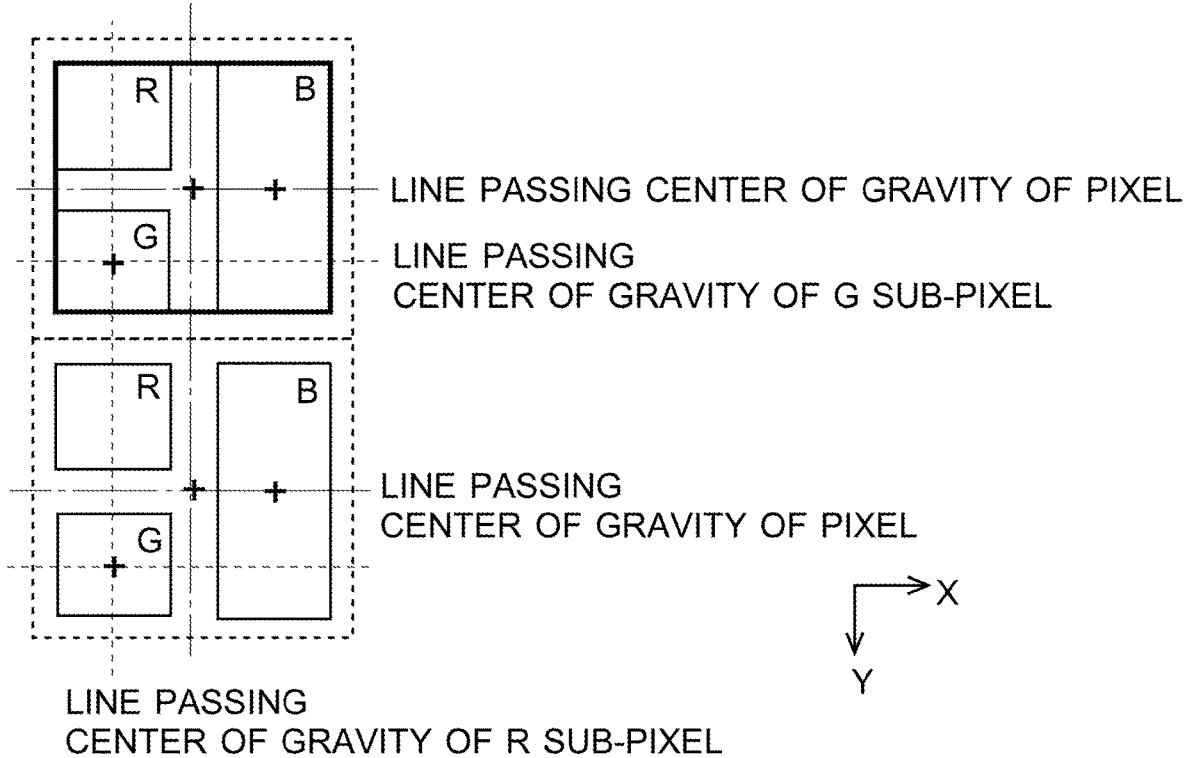
FIG. 8 is a plan view illustrating a positional relationship of subpixels in the conventional pixel array structure in the S-stripe arrangement.

Next, a pixel array structure of the organic EL display device having the above constitution is described. First, in order to make the comprehension of the present embodiment easy, description is given to the conventional pixel array structure of the S-stripe arrangement with reference to FIGS. 7 to 9. FIG. 7 is a plan view schematically illustrating the arrangement of RGB sub-pixels of pixels (two pixels neighboring to each other in the vertical direction) in the conventional S-stripe arrangement. FIG. 8 is a plan view illustrating the position of the center of gravity of each pixel and the position of the center of gravity of each of the G sub-pixel emitting light of the color which is the maximum in relative luminosity and the B sub-pixel emitting light of the color which is the minimum in relative luminosity. FIGS. 9A and 9B are spatial distribution diagrams of the relative luminosity corresponding to each of the RGB sub-pixels and the sum of these relative luminosities, in the Y direction indicated in FIG. 8 (the vertical direction in FIG. 8) and in the X direction indicated in FIG. 8 (the horizontal direction in FIG. 8), respectively. The relative luminosity represents relative sensitivity of a human eye to light of a certain wavelength, where the relative luminosity of light of the frequency or wavelength at the peak of a human-eye's response is assumed to be unity (one).

In FIGS. 7 through 24B, a R sub-pixel is arranged in the upper-left part of each pixel, a G sub-pixel emitting light of the color of the maximum relative luminosity is arranged in the lower-left part, and the B sub-pixel emitting light of the color of the minimum relative luminosity is arranged in the right part of each pixel. However, these sub-pixels may be arbitrarily arranged as far as a sub-pixel emitting light of the color of the minimum relative luminosity is the largest in size and is arranged adjacent to both of neighboring two corners (arranged so as to extend between the neighboring to corners) among the four corners of a pixel having a rectangular shape; a sub-pixel emitting light of the color of the maximum relative luminosity is arranged adjacent to one of the remaining two corners among the four corners of the pixel; and a sub-pixel emitting light of a color other than the colors of the maximum relative luminosity an the minimum relative luminosity is arranged adjacent to the other of the remaining two corners. In the pixel array structure of the present embodiment, a shape of each sub-pixel, a distance between sub-pixels, a distance between each sub-pixel and the periphery of a pixel, and other factors should not be restricted to the constitution shown in the figures, and may be modified appropriately in consideration of the production precision and the indication performance required for an organic EL display device.

Further, the boundary line (a broken line) of each pixel in FIGS. 8, 11, 14, 17, 20, and 23 should not be defined by the components of the TFT substrate 100, but should be defined by a relationship with neighboring groups of sub-pixels under the condition that the group of sub-pixels is repeatedly arranged. Although it is not necessarily for each pixel to have a rectangular shape, the shape is made to a rectangle in this example. In any cases, the center of gravity of a pixel in the present specification and claims is not the center of gravity of this rectangle, and is the center of gravity of a minimum rectangle (indicated with a thick line) surrounding a first-colored sub-pixel (G sub-pixel), a second-colored sub-pixel (R sub-pixel), and a third-colored sub-pixel (B sub-pixel), in other words, a position at which two diagonal lines of this minimum rectangle intersect with each other.

FIG. 9A illustrates the spatial distribution of the relative luminosities in the Y direction in the pixel array structure in the S-stripe arrangement illustrated in FIG. 7. As shown in FIG. 9A, the peak position of the spatial distribution of the relative luminosity corresponding to the B sub-pixel coincides with the center of gravity of the pixel, and the peak position of the spatial distribution of relative luminosity corresponding to the R sub-pixel and the peak position of the spatial distribution of relative luminosity corresponding to the G sub-pixel locate almost symmetrically with respect to the center of gravity of the pixel. FIG. 9B illustrates the spatial distribution of the relative luminosities in the X direction. As shown in FIG. 9B, the peak position of the spatial distribution of relative luminosity corresponding to the R sub-pixel coincides with the peak position of the spatial distribution of relative luminosity corresponding to the G sub-pixel, and the position of these peaks and the peak position of the spatial distribution of relative luminosity corresponding to the B sub-pixel locate almost symmetrically with respect to the center of gravity of the pixel.

FIGS. 10 to 12B illustrate one example (pattern 1) of the pixel array structure of the present embodiment. The pattern 1 has a feature that a part of the G sub-pixel emitting light of the color of the maximum relative luminosity is trimmed, where the portion is located far from the center of gravity of the pixel, in other words, is opposite to the part facing the center of gravity of the pixel (in FIG. 11, the lower left part of the G sub-pixel).

In the pixel array structure in the S-stripe arrangement shown in FIG. 10, the center of gravity (indicated with a cross mark in the FIG. 11) of the G sub-pixel is shifted in the upper right direction of the figure (in other words, in the direction in which the sub-pixel comes near to the center of gravity of the pixel) as compared with the center of gravity of the G sub-pixel in the conventional S-stripe arrangement, as illustrated in FIG. 11. In the case of this pixel arrangement structure, with regard to the spatial distribution of relative luminosities in the Y direction, as illustrated in FIG. 12A, the peak position of the spatial distribution of relative luminosity corresponding to the G sub-pixel (indicated with a short broken line in FIG. 12A) is shifted toward the center of gravity of the pixel (toward the side of the center of gravity of the-pixel) as compared with the center of gravity of the G sub-pixel in the conventional S-stripe arrangement. With regard to the spatial distribution of relative luminosities in the X direction, as illustrated in FIG. 12B, the peak position of the spatial distribution of relative luminosity corresponding to the G sub-pixel is shifted toward the center of gravity of the pixel as compared with the center of gravity of each the R and G sub-pixels in the conventional S-stripe arrangement. That is, the peak position of the spatial distribution of relative luminosity corresponding to the G sub-pixel emitting light of the color of the maximum relative luminosity comes closer to the center of gravity of the pixel, which decreases a distance of the peak position of the spatial distribution of relative luminosity corresponding to the G sub-pixel and the peak position of the spatial distribution of relative luminosity corresponding to the B sub-pixel emitting light of the color of the minimum relative luminosity. Accordingly, it makes possible to restrict the visibility of color fringing in the X direction, in the Y direction, and in the extending direction of the diagonal line (the diagonal line running from the upper left to the lower right in FIG. 11) of the pixel which does not pass the G sub-pixel.

FIGS. 13 to 15B illustrate another example (pattern 2) of the pixel array structure of the present embodiment. The pattern 2 has a feature that a part of the G sub-pixel emitting light of the color of the maximum relative luminosity is trimmed so as to stand back in comparison with the corresponding part of R sub-pixel (not merely shifted, the area or size of the sub-pixel is reduced), where the part is located far from the center of gravity of the pixel in the X direction, in other words, is opposite to the part facing the center of gravity of the pixel (in FIG. 14, the left part of the sub-pixel).

In the pixel arrangement structure of the S-stripe arrangement shown in FIG. 13, the center of gravity of the G sub-pixel is shifted toward the right-hand side of the figure (in other words, in the direction in which the sub-pixel comes near to the center of gravity of the pixel) as compared with the center of gravity of the G sub-pixel of the conventional S-stripe arrangement, as illustrated in FIG. 14. In the case of this pixel arrangement structure, with regard to the spatial distribution of relative luminosities in the Y direction, as illustrated in FIG. 15A, the peak position of the spatial distribution of relative luminosity corresponding to the G sub-pixel does not change. On the other hand, the relative luminosity corresponding to the G sub-pixel is made to lower relatively, whereby the largest peak of the spatial distribution of the total sum of the relative luminosities corresponding to the R, G, and B sub-pixels (indicated with a thick continuous line in FIG. 15A) is shifted slightly toward the center of gravity of the pixel. With regard to the spatial distribution of relative luminosities in the X direction, the peak position of the spatial distribution of relative luminosity corresponding to the G sub-pixel is shifted greatly toward the center of gravity of the pixel as compared with the center of gravity of each of the R and G sub-pixels of the conventional S-stripe arrangement, as illustrated in FIG. 15B. Also in this structure, since a distance between the peak position of the spatial distribution of relative luminosity corresponding to the G sub-pixel emitting light of the color of the maximum relative luminosity and the peak position of the spatial distribution of relative luminosity corresponding to the B sub-pixel emitting light of the color of the minimum relative luminosity becomes small, it makes possible to restrict the visibility of color fringing in the X direction, in the Y direction, and in the extending direction of the diagonal line of the pixel which does not pass the G sub-pixel.

FIGS. 16 to 18B illustrate still another example (pattern 3) of the pixel arrangement structure of the present embodiment. The pattern 3 has a feature that a part of the B sub-pixel emitting light of the color of the minimum relative luminosity is trimmed (the corner part is removed), where the part is located far from the center of gravity of the pixel and located in the half of the B sub-pixel facing the R sub-pixel (in FIG. 16, the upper right part of the sub-pixel).

The location of the center of gravity of the B sub-pixel in the pixel arrangement structure of the S-stripe arrangement shown in FIG. 16 is now described using FIGS. 17A and 17B. FIG. 17A is a plan view illustrating the position of the center of gravity of each pixel, and the position of the center of gravity of each of the G sub-pixel emitting light of the color which is the maximum in relative luminosity and the B sub-pixel emitting light of the color which is the minimum in relative luminosity. FIG. 17B is an enlarged view of one of pixels illustrated in FIG. 17A. As illustrated in FIG. 17B, a corner part of a half of the B sub-pixel, facing the R sub-pixel, is trimmed in comparison with the other half of the B sub-pixel, facing the G sub-pixel, where the trimmed corner part of the half of the B sub-pixel is farther from the other corner part of the half of the B sub-pixel. Under an assumption that the B sub-pixel is divided, by a line passing the center of gravity of the pixel and running in the X direction, into a part B1 facing the R sub-pixel and a part B2 facing the G sub-pixel, as illustrated in FIG. 17B, the center of gravity of the part B1 is located at a shorter distance in the X direction to the center of gravity of the pixel (see the distance L1 from the center of gravity of the part B1 to the center of gravity of the pixel in the X direction, illustrated in FIG. 17B) in comparison with a center of gravity of the part B2 of the third-colored sub-pixel (see the distance L2 from the center of gravity of the part B2 to the center of gravity of the pixel in the X direction, illustrated in FIG. 17B). Accordingly, as illustrated in FIG. 17A, the center of gravity of the B sub-pixel is shifted in the lower left direction in the figure (in other words, in the direction in which the sub-pixel comes near to the center of gravity of the pixel) as compared with the center of gravity of the B sub-pixel of the conventional S-stripe arrangement. In the case of this pixel arrangement structure, with regard to the spatial distribution of relative luminosities in the Y direction, as illustrated in FIG. 18A, the peak position of the spatial distribution of relative luminosity (indicated with a short broken line in FIG. 18A) corresponding to the B sub-pixel is shifted toward the center of gravity of the G sub-pixel as compared with the conventional S-stripe arrangement. With regard to the spatial distribution of relative luminosities in the X direction, as illustrated in FIG. 18B, the peak position of the spatial distribution of relative luminosity corresponding to the B sub-pixel is shifted toward the center of gravity of the pixel as compared with the center of gravity of the B sub-pixel of the conventional S-stripe arrangement. Also in this structure, since a distance between the peak position of the spatial distribution of relative luminosity corresponding to the G sub-pixel emitting light of the color of the maximum relative luminosity and the peak position of the spatial distribution of relative luminosity corresponding to the B sub-pixel emitting light of the color of the minimum relative luminosity becomes small, it makes possible to restrict the visibility of color fringing in the X direction, in the Y direction, and in the extending direction of the diagonal line of the pixel which does not pass the G sub-pixel.

FIGS. 19 to 21B illustrate still another example (pattern 4) of the pixel arrangement structure of the present embodiment. Similarly to the pattern 1, the pattern 4 has a feature that a part of the G sub-pixel emitting light of the color of the maximum relative luminosity is trimmed, where the part is located far from the center of gravity of the pixel (in FIG. 19, the lower left part of the G sub-pixel) and, similarly to the pattern 3, a part of the B sub-pixel emitting light of the color of the minimum relative luminosity is trimmed, where the part is located far from the center of gravity of the pixel (in FIG. 19, the upper right part of the B sub-pixel).

In the pixel arrangement structure of the S-stripe arrangement shown in FIG. 19, the center of gravity of the G sub-pixel is shifted in the upper right direction in the figure (in other words, in the direction in which the sub-pixel comes near to the center of gravity of the pixel) as compared with the center of gravity of the G sub-pixel of the conventional S-stripe arrangement, and the center of gravity of the B sub-pixel is shifted in the lower left direction in the figure (in other words, in the direction in which the sub-pixel comes near to the center of gravity of the pixel) as compared with the center of gravity of the B sub-pixel of the conventional S-stripe arrangement, as illustrated in FIG. 20. In the case of this pixel arrangement structure, with regard to the spatial distribution of relative luminosities in the Y direction, as illustrated in FIG. 21A, the peak position of the spatial distribution of relative luminosity corresponding to the G sub-pixel is shifted toward the center of gravity of the pixel as compared with the center of gravity of the G sub-pixel of the conventional S-stripe arrangement, and the peak position of the spatial distribution of relative luminosity corresponding to the B sub-pixel is shifted toward the center of gravity of the G sub-pixel as compared with the conventional S-stripe arrangement. With regard to the spatial distribution of relative luminosities in the X direction, as illustrated in FIG. 21B, the peak position of the spatial distribution of relative luminosity corresponding to the G sub-pixel is shifted toward the center of gravity of the pixel as compared with the center of gravity of each of the R and G sub-pixels in the conventional S-stripe arrangement, and the peak position of the spatial distribution of relative luminosity corresponding to the B sub-pixel is shifted toward the center of gravity of the pixel side as compared with the center of gravity of the B sub-pixel of the conventional S-stripe arrangement. Also in this structure, since a distance between the peak position of the spatial distribution of relative luminosity corresponding to the G sub-pixel emitting light of the color of the maximum relative luminosity and the peak position of the spatial distribution of relative luminosity corresponding to the B sub-pixel emitting light of the color of the minimum relative luminosity becomes small, it becomes makes to restrict the visibility of color fringing in the X direction, in the Y direction, and in the extending direction of the diagonal line of the pixel which does not pass the G sub-pixel.

FIGS. 22 to 24B illustrate still another example (pattern 5) of the pixel arrangement structure of the present embodiment. The pattern 5 has a feature that a part of the G sub-pixel emitting light of the color of the maximum relative luminosity is trimmed and stands back toward the center of gravity of the pixel in comparison with the corresponding part of the R sub-pixel (not merely shifted, the area or size is reduced), where the part is located far from the center of gravity of the pixel in the X direction (in FIG. 22, the left part of the sub-pixel), and a part of the R sub-pixel emitting light of the color other than colors of the maximum relative luminosity and the minimum relative luminosity is trimmed and stands back apart from the center of gravity of the pixel in comparison with the corresponding part of the G sub-pixel (not merely shifted, the area or size of the sub-pixel is reduced by the same amount as that of the G sub-pixel), where the part is located near to the center of gravity of the pixel in the X direction (the right portion of the sub-pixel in FIG. 22).

In the pixel arrangement structure of the S-stripe arrangement shown in FIG. 22, the G sub-pixel and the R sub-pixel are same in shape, and the G sub-pixel is located nearer to the B sub-pixel than the R. That is, the center of gravity of the G sub-pixel is shifted toward the right-hand side of the figure (in other words, in the direction in which the sub-pixel comes near to the center of gravity of the pixel) as compared with the center of gravity of the G sub-pixel of the conventional S-stripe arrangement, and the center of gravity of the R sub-pixel is shifted toward the left-hand side of the figure (in other words, in the direction in which the sub-pixel separates far from the center of gravity of the pixel) as compared with the center of gravity of the R sub-pixel of the conventional S-stripe arrangement, as illustrated in FIG. 23. In the case of this pixel arrangement structure, with regard to the spatial distribution of relative luminosities in the Y direction, as illustrated in FIG. 24A, the peak position of the spatial distribution of relative luminosity corresponding to each of the G sub-pixel and the R sub-pixel is not changed. On the other hand, the peak position of the spatial distribution of relative luminosity corresponding to each of the G sub-pixel and the R sub-pixel is made to lower similarly, whereby the color balance is maintained. With regard to the spatial distribution of relative luminosities in the X direction, the peak position of the spatial distribution of relative luminosity corresponding to the G sub-pixel is shifted greatly toward the center of gravity of the pixel as compared with the center of gravity of each of the R and G sub-pixels of the conventional S-stripe arrangement, as shown in FIG. 24B. Also in this structure, a distance between the peak position of the spatial distribution of relative luminosity corresponding to the G sub-pixel emitting light of the color of the maximum relative luminosity and the peak position of the spatial distribution of relative luminosity corresponding to the B sub-pixel emitting light of the color of the minimum relative luminosity becomes small, and the collapse of the color balance coming from the reduction of the area of the G sub-pixel is restricted. Accordingly, it makes possible to restrict the visibility of color fringing in the X direction, in the Y direction, and in the extending direction of the diagonal line of the pixel which does not pass the G sub-pixel.

Incidentally, the pixel array structure in the present embodiment may employ another pattern of subpixels such that, in the G sub-pixel emitting light of the color of the maximum relative luminosity and/or in the B sub-pixel emitting light of the color of the minimum relative luminosity, the sub-pixel shape is changed or the sub-pixel size is reduced so as to reduce a distance between the peak position of the spatial distribution of relative luminosity corresponding to the G sub-pixel and the peak position of the spatial distribution of relative luminosity corresponding to the B sub-pixel. Further, it is also possible to combine the patterns 1 to 5 arbitrarily to be applied to the pixel array structure.

EXAMPLES

Example 1

Next, description is given to a pixel array and an electro-optic device of EXAMPLE 1 with reference to FIGS. 25 to 32.

In the above-mentioned embodiment, description is given especially to the pixel array structure of the electro-optic device (organic EL display device). In this example, description is given to a production method of an organic EL display device equipped with a pixel array having this pixel array structure. Each of FIGS. 25, 27, 29, and 31 is a partial plan view, which corresponds to a single pixel, of the pixel array structure similarly to the pattern 4 shown in FIG. 19, and each of FIGS. 26, 28, 30, and 32 is a partial cross-sectional view, which corresponds to a single sub-pixel, of a TFT section 108 (including the switch TFT 108a and the drive TFT 108b), the storage capacitor section 109, and the light emitting element 116.

First, as illustrated in FIG. 25 and FIG. 26, a base insulating film 102 is formed by depositing a silicon nitride film by a CVD (Chemical Vapor Deposition) method, on a substrate (glass substrate 101) formed of a light-transmitting material such as glass. Next, a TFT section 108 and a storage capacitor section 109 are formed by using a well-known production technique of low-temperature polycrystalline silicon TFT. Concretely, amorphous silicon is deposited on the base insulating film 102 by a CVD method, and then crystalized by an ELA (Excimer Laser Annealing) to form a polycrystalline silicon layer. In this process, as illustrated in FIG. 25, the polycrystalline silicon layers 103 is formed into structures as illustrated in FIG. 25 for the purposes of securing a sufficient channel length of the drive TFT 108b used as a voltage-to-current conversion amplifier so as to reduce fluctuation of an output current, and of securing contact between the source of the switch TFT 108a and the data line 107a, contact between the drain of the switch TFT 108a and the storage capacitor section 109, contact between the storage capacitor section 109 and the power-supply line 107b, contact between the source of the drive TFT 108b and the power-supply line 107b, and contact between the drain of the drive TFT 108b to the anode electrode 111 of each sub-pixel.

Next, as illustrated in FIG. 27 and FIG. 28, on the polycrystalline silicon layer 103, a gate insulating film 104 is formed by depositing a silicon oxide film by a CVD method, and further, a first metal layer 105 is formed by depositing a material such as Mo (molybdenum), Nb (niobium), and an alloy with W (tungsten) by using a sputtering method to form a gate electrode 105a and a storage capacitor electrode 105b. For example, the first metal layer 105 may be a single layer formed with a single substance selected from a group consisting of Mo, W, Nb, MoW, MoNb, Al, Nd, Ti, Cu, a Cu alloy, an Al alloy, Ag, an Ag alloy, and the like. Alternately, the first metal layer 105 may be a single lamination structure constituted by two or more layers formed of lower resistance substances such as Mo, Cu, Al, and Ag in order to decrease a wiring resistance. In this process, in order to increase a storage capacitance in each sub-pixel and securing easy contact between the drain of the switch TFT 108a of each sub-pixel and the storage capacitor electrode 105b, the first metal layer 105 is formed into the shapes illustrated in FIG. 27. Next, the polycrystalline silicon layer 103 which has been doped with a high concentration impurity layer (a p+ polycrystalline silicon layer 103c) before the formation of a gate electrode is subjected to additional impurity doping by using the gate electrode 105 as a mask so as to form a low concentration impurity layer (a p− polycrystalline silicon layer 103b), whereby an LDD (Lightly Doped Drain) structure is formed in the TFT section.

Next, as illustrated in FIG. 29 and FIG. 30, an interlayer insulating film 106 is formed, for example, by depositing a silicon oxide film by a CVD method. This interlayer insulating film 106 and the gate insulating film 104 are processed by anisotropic etching so as to open contact holes (parts indicated with thick broken lines in FIG. 29) for connecting with the polycrystalline silicon layer (i-polycrystalline silicon layer 103a, p− polycrystalline silicon layer 103b, and p+ polycrystalline silicon layer 103c). Next, a second metal layer 107 is formed by depositing an aluminum alloy, such as Ti/Al/Ti by a sputtering method and is patterned to form source/drain electrodes, data lines 107a, power-supply lines 107b, and first contact sections 107c. In FIG. 29, the data line 107a for the R sub-pixel, the data line 107a for the G sub-pixel, the data line 107a for the B sub-pixel are arranged in order from left to right; and the power-supply line 107b for the R sub-pixel, the power-supply line 107b for the G sub-pixel, and the power-supply line 107b for the B sub-pixel are arranged in order from left to right. With this process, the data line 107a is connected to the source of the switch TFT 108a, the drain of the switch TFT 108a is connected to the storage capacitor electrode 105b and the gate of the drive TFT 108b, and the source of the drive TFT 108b is connected to the power-supply line 107b.

Next, as illustrated in FIG. 31 and FIG. 32, a photosensitive organic material is applied on the structure of FIG. 30 to form a flattened film 110. Then, contact holes (parts each indicated with thick continuous lines with an X mark) are opened on the flattened film 110 with an exposure condition optimized so as to adjust a taper angle of each contact hole, for connecting with the drain of the drive TFT 108b. In this process, the part of the flattened film 110, where the contact hole is formed, may become not flat, and if a light emitting element 116 is formed on it, such a construction may make light emission of the light emitting element 116 uneven. Accordingly, in this example, the contact hole is arranged at the location where a sub-pixel is trimmed (for example, the upper right contact hole in FIG. 31) of a sub-pixel as far as possible. On this structure, metal such as Ag, Mg, Al, Pt, Pd, Au, Ni, Nd, Ir, Cr and a compound of them is deposited. On the resulting structure, a material such as ITO, IZO, ZnO and $In_2O_3$ is deposited successively to form a transparent film, and at the same time, the transparent film is patterned to form the anode electrode 111 of each sub-pixel. The anode electrode 111 is connected to the drain of the drive TFT 108b at the second contact section 111a. In the case that the light emitting elements 116 have a top-emission structure, the anode electrode 111 needs a reflective film so that the anode electrode 111 serves also as a reflective film. In the case that the light emitting elements 116 have a bottom-emission structure, a reflective film can be omitted, and the anode electrode 111 is formed with only a transparent film made of ITO. Next, a photosensitive organic resin is applied by a spin coat method to form an element separation layer 112, and the element separation layer 112 is patterned so as to expose the anode electrode 111 of each sub-pixel at the bottom of the element separation layer 112. With this element separation layer, the light emitting region of each sub-pixel is separated from other light emitting regions.

Next, the glass substrate 101 on which the element separation film 112 has been formed is set to a vapor deposition apparatus, a FMM in which apertures are formed only at the parts corresponding to sub-pixels for the same color or an open mask in which apertures are formed only on display screen regions and their peripheral portions is positioned and fixed onto the glass substrate 101 as occasion demands, and organic materials are deposited to form an organic EL layer 113 on the anode electrode 111. The organic EL layer 113 is constituted by, from the bottom side, for example, a positive hole injection layer, a positive hole transporting layer, a light emitting layer, an electron transporting layer, and an electron injection layer. Alternatively, the organic EL layer 113 may have any one of a structure constituted by an electron transporting layer, a light emitting layer, and a positive hole transporting layer; a structure constituted by an electron transporting layer, a light emitting layer, a positive hole transporting layer, and a positive hole injection layer; a structure constituted by an electron injection layer, an electron transporting layer, a light emitting layer, and a positive hole transporting layer; and only a light emitting layer, where these structures may additionally include an electronic blocking layer. Different materials are used for the light emitting layers in different colored sub-pixels, and the film thickness of each of a positive hole injection layer, a positive hole transporting layer and the like is individually controlled for each sub-pixel as required.

On this organic EL layer 113, a metal with a small work function, i.e., Li, Ca, LiF/Ca, LiF/Al, Al, Mg, and a compound of them is deposited by vapor-depositing to form a cathode electrode 114. In order to enhance light extraction efficiency and to secure good viewing angle dependency, the film thickness of the cathode electrode is optimized. In the case where the resistance of the cathode electrode is high and the uniformity of light emission luminance is spoiled, an auxiliary electrode layer is added on it with a substance for making a transparent electrode, such as ITO, IZO, ZnO, and $In_2O_3$. Further, in order to enhance light extraction efficiency, an insulating film with a refractive index higher than glass is deposited to form a cap layer 115. The cap layer also serves a protection layer of an organic EL element.

With the above processes, the light emitting element 116 corresponding to each of R, G, and B sub-pixels is formed, and parts at which the anode electrode 111 and the organic EL layer 113 come in contact with each other (apertures of the element separation film 112) becomes an R light emitting region 117, a G light emitting region 118, and a B light emitting region 119.

In the case where the light emitting elements 116 have a bottom-emission structure, a cathode electrode 114 (a transparent electrode, such as ITO) may be formed on the flattened film 110, and an anode electrode 111 (a reflection electrode) may be formed on the organic EL layer 113. In the bottom-emission structure, there is no need to make light goes out from the top face, which allows a film made of metal, such as Al, to be thick, and allows the resistance value of a cathode electrode to be decreased greatly. Accordingly, the bottom-emission structure is suitable for enlargement of the pixel array. However, light cannot pass through a TFT element and a wiring portion and, a light emitting region becomes extremely small. Accordingly, the bottom-emission structure is not suitable for providing high definition.

Next, glass frit is applied on the outer periphery of the TFT substrate 100, and the sealing glass substrate 200 is placed on it. Successively, the glass frit portion is heated with a laser and melted, whereby the TFT substrate 100 and the sealing glass substrate 200 are sealed. Subsequently, a $\lambda/4$ retardation plate 201 and a polarization plate 202 are formed on the light-outgoing-side surface of the optical sealing glass substrate 200, whereby an organic EL display device is completed.

FIGS. 25 to 32 illustrate one example of the production method of the organic EL display device in this example, and the production method in not limited specifically as long as the pixel array structure shown in the embodiment can be realized.

Example 2

Next, description is given to an electro-optic apparatus and electric apparatus of EXAMPLE 2 with reference to FIGS. 33 to 36. In this example, description is given to various electric apparatuses employing an organic EL display device as a display unit, which are application examples of an organic EL display device.

Each of FIGS. 33 to 36 illustrates an example of an electric apparatus to which the electro-optic device (organic EL display device) as an embodiment of the present invention can be applied. FIG. 33 shows a personal computer as an application example, FIG. 34 shows a mobile terminal device, such as PDA (Personal Digital Assistants), an electronic notebook, an electronic book, and a tablet terminal, as an application example, FIG. 35 shows a smart phone as an application example, and FIG. 36 shows a mobile telephone as an application example. The organic EL display device of the present example can be used for the display unit of each of these electric apparatuses. An electric apparatus as an application example is not limited to the above apparatuses. It can be an arbitrary electric apparatus as long as the electric apparatus is equipped with a display unit. For example, the organic EL display device of the above example can be applied to a digital camera, a video camera, a head mounted display, a projector, a fax machine, a mobile TV, a DSP (Demand Side Platform) device and the like.

Example 3

Next, description is given to an electro-optic device and an electric apparatus of EXAMPLE 3 with reference to FIGS. 37 to 40. In the above-mentioned Example 2, description is given to the case where an organic EL display device as the electro-optic device is applied to an electric apparatus equipped with a planar display unit. However, an organic EL display device made to have a deformable structure, and can be applied to an electric apparatus which needs a display unit with a curved surface.

FIG. 37 is a cross-sectional view illustrating the structure of a deformable organic EL display device. The structure of EXAMPLE 3 is different from that of EXAMPLE 1 in a point (1) that the TFT sections 108 (switch TFT 108a and drive TFT 108b) and the storage capacitor section 109 are formed on a flexible substrate and in a point (2) that the sealing glass substrate 200 is not arranged on the light emitting elements 116.

First, with regard to the point (1), a peelable film 120 made of a material removable with a peeling liquid, such as organic resin, is formed on a glass substrate 101, and a flexible substrate 121 made of a material with flexibility, such as polyimide, is formed on the peelable film 120. Next, inorganic thin films 122, such as a silicon oxide film and a silicon nitride film, and an organic film 123, such as organic resin film, are laminated alternately. Successively, in accordance with the production method shown in EXAMPLE 1, on the uppermost film (in this example, an inorganic thin film 124), the base insulating film 102, the polycrystalline silicon layer (i-polycrystalline silicon layer 103a, p– polycrystalline silicon layer 103b, and p+ polycrystalline silicon layer 103c), the gate insulating film 104, the first metal layer 105, the interlayer insulating film 106, the second metal layer 107, and the flattened film 110 are formed sequentially, whereby the TFT section 108 (switch TFT 108a and derive TFT 108b) and the storage capacitor section 109 are formed.

Further, with regard to the point (2), on the flattened film 110, the anode electrode 111 and the element separation film 112 are formed, and on the bank layer in which the element separation film 112 is removed, the organic EL layer 113, the cathode electrode 114, and the cap layer 115 are formed sequentially, whereby the light emitting element 116 is formed. Subsequently, on the cap layer 115, the inorganic thin film 124, such as a silicon oxide film and a silicon nitride film, and the organic layer 125, such as organic resin layer, are laminated alternately, and then, on the uppermost film (in this example, the organic layer 125), the λ/4 retardation plate 126 and the polarization plate 127 are formed.

Thereafter, the peelable film 120 on the glass substrate 101 is removed with a peeling liquid, and the glass substrate 101 is removed. In this structure, there is neither the glass substrate 101 nor the sealing glass substrate 200, and the whole organic EL display device is deformable. Such an organic EL display device can be used for electric apparatuses for various purposes requiring a display unit with a curved surface, in particular, for wearable electric apparatuses.

For example, the organic EL display device of the present example can be used for a display unit of a wristband type electric apparatus configured to be attached to a wrist as shown in FIG. 38 (for example, a terminal interlocking with a smart phone, a terminal equipped with a GPS (Global Positioning System) function, a terminal to measure human body information, such as a pulse and body temperature). In the case of a terminal interlocking with a smart phone, an organic EL display device is enabled to display image data and picture image data received by using a communication unit disposed beforehand in the terminal (for example, a short distance wireless communication unit configured to operate in accordance with standards, such as Bluetooth (registered trademark) and NFC (Near Field Communication)). Further, in the case of a terminal equipped with a GPS function, an organic EL display device is enabled to display the positional information, the moving distance information, and the moving speed information, which are specified based on GPS signals. Further, in the case of a terminal configured to measure human body information, an organic EL display device is enabled to display the measured information.

Further, an organic EL display device of the present example can be used for electronic paper as shown in FIG. 39. For example, an organic EL display device is enabled to display image data and picture image data memorized in a memory unit disposed at an end portion of electronic paper. Also, an organic EL display device is enabled to display image data and picture image data received by using an interface unit disposed at an end portion of electronic paper (for example, a cable communication unit, such as USB (Universal Serial Bus), or a wireless communication unit configured to operate in accordance with standards, such as Ethernet (registered trademark), FDDI (Fiber-Distributed Data Interface), and Token Ring).

Further, an organic EL display device of the present example can be used for a display unit of a glass type electric apparatus configured to be put on a face as shown in FIG. 40. For example, an organic EL display device is enabled to display image data and picture image data memorized in a memory unit disposed on a temple of glasses, sunglasses and goggles. Also, an organic EL display device is enabled to display image data and picture image data received by using an interface unit disposed on a temple (for example, a cable communication unit, such as USB, a short distance radio communication unit configured to operate in accordance with standards, such as Bluetooth (registered trademark) and NFC, and a mobile object communication unit configured to communicate by using a mobile object communication network, such as LTE (Long Term Evolution)/3G).

The present invention should not be limited to the above-mentioned embodiments and examples, and unless there is deviation from the intention of the present invention, modification may be made appropriately for the type and structure of the electro-optic device, the material of each constitution component, a production method, and the like.

For example, in the above embodiments and examples, description is given to the constitution in which pixels constituted by R, G, and B sub-pixels are arranged in the form of a lattice. However, the way to array the pixels should not be limited to the form of a lattice. For example, the present invention may be applied to a constitution in which pixels are arrayed such that pixels in a line neighboring in the vertical or horizontal direction are shifted by a distance corresponding to half of a pixel.

Further, in the above embodiment and examples, sub-pixels in three colors of R, G, and B are used. Alternatively, a pixel array structure as one embodiment of the present invention may use sub-pixels of arbitrary three colors of different relative luminosities.

Further, an electro-optic device as one embodiment of the present invention should not be limited to the organic EL display device shown in the above embodiments and examples. The substrate on which pixels are formed should not be limited to the TFT substrate shown in the above embodiments and examples. The substrate on which pixels are formed can be applied not only to an active-element substrate, but also to a passive-element substrate. Further, as a circuit to control pixels, exemplification is made to the circuit (a so-called 2T1C circuit) constituted by the switch TFT 108*a*, the drive TFT 108*b*, and the storage capacitor section 109. However, it may be also possible to adopt a circuit (for example, a 3T1C circuit) equipped with three or more transistors.

The present invention can be applied to electro-optic devices, such as an organic EL display device equipped with a pixel array in which pixels each including multiple sub-pixels are arranged two-dimensionally, and electric apparatuses configured to use the electro-optic device as a display unit.

The invention claimed is:

1. A pixel array comprising:
a plurality of main pixels, each of the main pixels including a first sub-pixel, a second sub-pixel, and a third sub-pixel
wherein the plurality of main pixels are arrayed in a first direction and in a second direction different from the first direction,
the first sub-pixel and the second sub-pixel are arranged alternately along the first direction,
the third sub-pixel is arranged next to the first and second sub-pixels in the second direction,
each of the main pixels has a main center of gravity defined as an intersection of two diagonal lines of a minimum rectangle surrounding the main pixel,
the first sub-pixel has a first center of gravity defined as an intersection of two diagonal lines of a minimum rectangle surrounding the first sub-pixel,
the second sub-pixel has a second center of gravity defined as an intersection of two diagonal lines of a minimum rectangle surrounding the second sub-pixel,
the first sub-pixel has at least a first side, a second side, and a third side, the first and second sides of the first sub-pixel being adjacent to each other, the first side and the second side of the first sub-pixel each corresponding to a first side and a second side of the minimum rectangle surrounding the first sub-pixel, and the third side of the first sub-pixel intersecting with a third side and a fourth side of the minimum rectangle surrounding the first sub-pixel,
the first center of gravity is located nearer to the main center of gravity than the second center of gravity, and
the first sub-pixel emits light of a green color, the second sub-pixel emits light of a red color, and the third sub-pixel emits light of a blue color.

2. The pixel array according to claim 1, wherein
the third side is a line which does not include a right angle.

3. The pixel array according to claim 1, wherein
the first sub-pixel further has at least a fourth side and a fifth side,
the fourth side of the first sub-pixel is adjacent to the fifth side,
the fifth side of the first sub-pixel is adjacent to the second side,
the fourth side of the first sub-pixel is included in the third side of the minimum rectangle surrounding the first sub-pixel, and
the fifth side of the first sub-pixel is included in the fourth side of the minimum rectangle surrounding the first sub-pixel.

4. The pixel array according to claim 3, wherein
in the first sub-pixel, the first and second sides of the first sub-pixel are longer than the third to fifth sides of the first sub-pixel, and the third side of the first sub-pixel is longer than the fourth and fifth sides of the first sub-pixel.

5. The pixel array according to claim 1, wherein
a first virtual line parallel to the first direction and passing the first center of gravity does not coincide with a second virtual line parallel to the first direction and passing the second center of gravity.

6. The pixel array according to claim 1, wherein
the first sub-pixel comprises a first light emitting region including an organic electro luminescence element,
the second sub-pixel comprises a second light emitting region including an organic electro luminescence element,
the minimum rectangle surrounding the first sub-pixel is a minimum rectangle surrounding the first light emitting region, and
the minimum rectangle surrounding the second sub-pixel is a minimum rectangle surrounding the second light emitting region.

7. The pixel array according to claim 6, wherein
the first sub-pixel comprises a pixel circuit configured to control the first light emitting region to emit light, and
the pixel circuit is located under the first light emitting region.

8. An electro-optic device comprising:
a pixel array comprising:
a plurality of main pixels, each of the main pixels including a first sub-pixel, a second sub-pixel, and a third sub-pixel,
wherein the plurality of main pixels is arrayed in a first direction and in a second direction different from the first direction,
the first sub-pixel and the second sub-pixel are arranged alternately along the first direction,
the third sub-pixel is arranged next to the first and second sub-pixels in the second direction,
each of the main pixels has a main center of gravity defined as an intersection of two diagonal lines of a minimum rectangle surrounding the main pixel,
the first sub-pixel has a first center of gravity defined as an intersection of two diagonal lines of a minimum rectangle surrounding the first sub-pixel, the second sub-pixel has a second center of gravity defined as an intersection of two diagonal lines of a minimum rectangle surrounding the second sub-pixel, the first sub--pixel has at least a first side, a second side, and a third side, the first and second sides of the first sub-pixel being adjacent to each other, the first side and the second side of the first sub-pixel each corresponding to a first side and a second side of the minimum rectangle surrounding the first sub-pixel, and the third side of the first sub-pixel intersecting with a third side and a fourth side of the minimum rectangle surrounding the first sub-pixel, the first center of gravity is located nearer to the main center of gravity than the second center of gravity, and the first sub-pixel emits light of a green color, the second sub-pixel emits light of a red color, and the third sub-pixel emits light of a blue color; and a circuit to drive the pixel array.

9. An electric apparatus comprising:

an organic electroluminescence device as a display unit, the organic electroluminescence device including organic electro luminescence elements forming the pixel array according to claim 1, a circuit to drive the pixel array, and a flexible substrate on which the pixel array and the circuit are formed.

\* \* \* \* \*